(12) United States Patent
Nathan et al.

(10) Patent No.: US 6,528,351 B1
(45) Date of Patent: Mar. 4, 2003

(54) INTEGRATED PACKAGE AND METHODS FOR MAKING SAME

(75) Inventors: Richard J. Nathan, Morgan Hill, CA (US); William H. Shepherd, Placitas, NM (US)

(73) Assignee: JigSaw tek, Inc., Gilroy, CA (US)

( * ) Notice: Subject to any disclaimer, the term of this patent is extended or adjusted under 35 U.S.C. 154(b) by 0 days.

(21) Appl. No.: 09/963,337

(22) Filed: Sep. 24, 2001

(51) Int. Cl.[7] .............................................. H01L 21/44
(52) U.S. Cl. ........................ 438/118; 438/124; 438/126; 438/127
(58) Field of Search ................................ 438/118, 121, 438/122, 123, 124, 125, 126, 127

(56) References Cited

U.S. PATENT DOCUMENTS

| | | | | |
|---|---|---|---|---|
| 4,722,914 A | * | 2/1988 | Drye et al. | 438/125 |
| 5,032,896 A | * | 7/1991 | Little et al. | 257/686 |
| 5,063,177 A | | 11/1991 | Geller et al. | |
| 5,188,984 A | * | 2/1993 | Nishiguchi | 438/125 |
| 5,353,498 A | * | 10/1994 | Fillion et al. | 438/118 |
| 5,545,291 A | | 8/1996 | Smith et al. | |
| 5,701,233 A | | 12/1997 | Carson et al. | |
| 5,745,984 A | * | 5/1998 | Cole et al. | 438/118 |
| 5,756,368 A | | 5/1998 | Peterson et al. | |
| 5,783,856 A | | 7/1998 | Smith et al. | |
| 5,949,133 A | * | 9/1999 | Wojnarowski | 257/668 |
| 6,175,161 B1 | | 1/2001 | Goetz et al. | |
| 6,204,095 B1 | * | 3/2001 | Farnworth | 438/127 |
| 6,239,496 B1 | | 5/2001 | Asada | |
| 6,309,912 B1 | * | 10/2001 | Chiou et al. | 438/126 |

* cited by examiner

*Primary Examiner*—Kevin M. Picardat
(74) *Attorney, Agent, or Firm*—Silicon Valley Patent Group LLP; Onkar Suryadevara

(57) ABSTRACT

One or more integrated circuit chips each containing conductive pads on one surface, are embedded in a substrate such that the conductive pads are exposed and the one surface of each chip is substantially coplanar with a top surface of the substrate. Electrically conductive material is placed over the one surface, including conductive pads, of each chip and the top surface of the substrate and patterned, using standard semiconductor or printed circuit photolithographic and processing techniques to form an electrically conductive interconnect pattern connecting the one or more integrated circuit chips into an electronic system. When a single integrated circuit chip is to be embedded in a substrate, the invention makes possible the simultaneous manufacture of a plurality of such packaged integrated circuit chips in a single large substrate using standard semiconductor or printed circuit photolithographic and processing techniques and then singulating the large substrate into a plurality of smaller substrates, each containing a single integrated circuit chip. Likewise, when more than one integrated circuit chip is embedded in a substrate, a plurality of such structures can be manufactured in a single large substrate and then singulated into a plurality of smaller substrates, each containing more than one integrated circuit chips.

17 Claims, 11 Drawing Sheets

INTEGRATED PACKAGE AND METHODS FOR MAKING SAME

RELATED APPLICATION

Patent application Ser. No. 09/953,005 filed Sep. 13, 2001 discloses methods for fabricating a monolithic integrated structure incorporating one or more packaged components such as integrated circuit chips or discrete elements such as resistors, capacitors, inductors, transistors, LEDs, optical devices, MEMs, or photocouplers, for example.

FIELD OF THE INVENTION

This invention relates to an integrated monolithic structure containing one or more electronic systems and, in particular, to a substrate containing one or more integrated circuit chips placed in the substrate such that the top surface of each chip contains electrically conductive lands or electrically conductive pads and is substantially coplanar with the top surface of the substrate such that conductive traces can be formed over the top surfaces of the integrated circuit chips and the substrate to interconnect integrated circuit chips into one or more desired electronic systems.

BACKGROUND OF THE INVENTION

For many years, the semiconductor industry has been attempting to fabricate a system on a chip. In particular, the industry has attempted to combine linear and digital circuitry on the same chip and often to include memory on the chip to provide an electronic system on a single integrated circuit chip. Unfortunately, the additional processing steps create yield loss such that if a single component of the chip fails, all components on the chip are useless. As a result, multi-chip modules in particular are commonly used to create electronic systems.

Some companies have combined logic and memory on a chip. Microprocessors, programmable logic and graphics circuits, in particular, incorporate logic circuitry together with memory.

Accordingly, there exists a need for a monolithic, integrated structure which can incorporate the functions represented by semiconductor chips fabricated using different technologies, such as analog and digital, so as to form one or more partial or entire electronic systems.

SUMMARY OF THE INVENTION

In accordance with this invention, one or more integrated circuit chips is placed or are combined in a substrate such that the chip or chips can be electrically contacted or interconnected using standard photolithographic processes to form a single integrated circuit package or an electronic system. The chips can be from different technologies, even from substrates that are totally incompatible. Thus, chips fabricated using silicon and gallium-arsenide technology can be placed in the monolithic structure of this invention and interconnected so as to operate together as part of an electronic system.

In addition, integrated circuit chips fabricated using normal 100 silicon can be combined using the methods of this invention with integrated circuit chips fabricated using 111 silicon as well as with gallium-arsenide chips, for example, to yield a composite structure.

The process of this invention allows semiconductor chips using different technologies to be combined in a single monolithic, integrated structure of high reliability and to be interconnected using standard photolithographic processing currently available in the semiconductor industry and/or the printed circuit board industry.

In accordance with a process of this invention, two or more integrated circuit chips of the same type or disparate types are placed in two or more cavities, respectively, in a substrate. Adhesive bonding material is placed on the surface of the cavity and in the interconnect spaces between the integrated circuit chips and the cavity walls and allowed to set thereby to adherently hold the integrated circuit chips in their respective cavities. The chips are placed in the cavities such that conductive pads face outward from the cavity and are visible as well as being substantially in the same plane as the top surface of the substrate. A conductive layer is then deposited over the top surface of the substrate and the exposed surfaces and conductive pads of the integrated circuit chips contained in the substrate cavities. Standard photolithographic techniques are then used to mask and etch the conductive layer to form a conductive interconnect pattern to interconnect the two or more chips into the desired electronic system.

In accordance with one embodiment of this invention, the integrated circuit chips can be of different types, different materials and carry out different functions, and yet when interconnected together, form a unitary monolithic electronic system of high quality and great reliability.

In accordance with another embodiment of this invention, a plastic substrate is made with cavities having sides with fixed angles such that cross-sections of the cavities are trapezoidal. The substrate may be manufactured using a mold that is custom created for each type package system. Typically, each package contains a single device or a multichip module and is substantially smaller than a standard 18 inch by 24 inch plastic substrate. Therefore, the routing pattern for each package is stepped and repeated across the plastic substrate to create a plurality of identical packages.

A plastic such as Mylar, Melinex or Delrin may be injected into the mold to produce the substrate with the desired cavities with the specific angled sidewalls, which may vary from vertical to plus or minus 45 degrees or greater. Other thermoplastic, thermoset or composite plastics could be used. All cavities are through-hole cavities and have their largest dimensions on the same side of the substrate. The thickness of the substrate can vary from a few thousandths of an inch to more than one quarter of an inch. Typically, the cavities are similar in thickness to the integrated circuits that are to be inserted into them. However, if the cavities are made using angled sidewalls, components with similar angled sides will naturally center themselves when inserted.

A planarizing layer, such as a planar stainless steel or quartz plate, of the same dimensions as the substrate, is temporarily attached to the side of the substrate where the cavity dimensions are smaller. The planarizing layer may be coated with a soft, non-sticking film, such as but not limited to Teflon. Various methods can be used to attach the substrate to the planarizing layer including clamps or temporary adhesives.

Integrated circuits and other active or passive devices that have their bonding pads on the topside in either an array or peripheral pattern are manufactured with angled sidewalls that typically match the angles of the cavities into which they will be inserted. The topsides of the integrated circuits are made to match the smaller dimensions of the substrate cavities. The angles on the sidewalls of the integrated circuits in one embodiment are made using a diamond saw whose blade has a specific angle which may match the angle created in the cavity. Alternatively, anisotropic etching can also be used to create specific angles of the sidewalls on the integrated circuits that match angles of the sidewalls of the cavities in the substrate.

The integrated circuits are inserted into their matching cavities on the substrate with their topsides on the matching bottom of the cavity and their backsides exposed. A prepreg layer (resin implanted with glass or aramid fiber) is applied to the backside of the integrated structure (i.e. to the exposed backsides of the integrated circuits and the adjacent exposed surface of the substrate) and the temperature and pressure are increased causing the prepreg material to soften and flow around the integrated circuits and into all crevices that may exist between the integrated circuits and the substrate. The temperature is lowered, the pressure is released and the cured prepreg permanently holds each integrated circuit in its respective cavity, the top side of each integrated circuit being forced into coplanarity with the top surface of the substrate. The planarizing layer may then be removed to expose the top sides with conductive pads of the integrated circuits and the coplanar top surface of the substrate.

Metal, such as copper, is deposited over the entire top surface of the structure, covering the original substrate as well as the topsides and the bonding pads of the integrated circuits. The metal may be plated or applied by other processes such as sputtering or evaporation. A photosensitive material is then applied to the metal layer and the interconnect pattern is defined and etched in a well known manner to form the desired electrically conductive interconnect pattern. In some cases it may be desirable to connect the integrated circuits using multi-layer metal patterns with or without ground or Vcc planes inserted between the routing layers.

One of the advantages of this invention is that bonding pads on the integrated circuit chips can be positioned above the circuitry formed in the integrated circuit chip rather than maintained solely on the periphery of the integrated circuit chip. Prior art bonding pads were located on the periphery of the chip to prevent the pressure generated during thermal compression bonding of lead wires to the bonding pads from damaging underlying circuitry. This invention allows such bonding pads or conductive lands to be placed on dielectric over the circuitry because the electrical connections between the bonding pads and external circuitry are implemented by electrically conductive leads deposited on the top surfaces of the integrated circuit chips and the top surface of the substrate using a process which creates no pressure on the underlying circuitry. As a result, smaller integrated circuit chips can be fabricated thereby allowing manufacturers to place more die on a wafer and thus substantially reduce the cost of the resulting die. Consequently, the cost of the resulting packaged integrated circuit chip is also reduced. Furthermore, this invention allows standard semiconductor or printed circuit board processing techniques to be used to fabricate a plurality of integrated circuit packages at the same time thereby further reducing the cost of each package. When printed circuit board fabrication technologies are used in accordance with this invention, very large numbers of semiconductor die can be electrically interconnected to leads on a substrate using the techniques of this invention. The subsequent structure can then be further processed in accordance with well known techniques to complete semiconductor packages for the die contained on the substrate. The final structure can then be singulated to separate each of the packaged die.

An additional advantage of this invention is that solder bumps used for assembling flip chip packages can be eliminated. Environmentally, since solder bumps contain lead, this is a tremendous advantage over the prior art.

The structure of this invention provides the same array patterns that can be used in the prior art flip chip arrangement but avoids the blind contacts required using the flip chip technology, eliminates the lead bumps, eliminates underfill (used to prevent cracking of the die), and distributes the contact interface between chip and substrate, eliminating thermally induced cracking of the die. The result is to increase the reliability and quality of the semiconductor systems fabricated in accordance with this invention.

In one embodiment, the conductive layer formed on the top surfaces of the integrated circuit chips and the substrate is copper. Once fabricated, the electrically conductive interconnect lead pattern is capable of being visually inspected. Thus, the quality of the resulting structure is significantly improved over the prior art, as is the yield.

Should a single cavity only be formed in the substrate, then the structure of this invention provides a compact, easily and/or economically manufactured, package for the integrated circuit chip which eliminates substantial cost from the final integrated circuit chip package. This invention results in an integrated circuit chip package having electrical connections to the integrated circuit chip which have lower inductance and capacitance than prior art packages and which provides a lower cost, thinner and higher performing package than in the prior art. The integrated circuit chip package of this invention can be fabricated using a large substrate in which a plurality (such as thousands) of identical cavities are formed to receive a corresponding plurality (i.e. thousands) of identical integrated circuit chips. Upon completion of the process, the resulting composite structure can then be singulated using standard scoring processes in the semiconductor and printed circuit arts. If desired a plurality of non-identical integrated circuits can be placed in a plurality of non-identical cavities (which dimensionally match the dimensions of the non-identical integrated circuits), in the same substrate which can then be singulated as described above.

This invention will be more clearly understood in conjunction with the following detailed description taken together with the following drawings.

BRIEF DESCRIPTION OF THE DRAWINGS

FIG. 10b illustrates a side-view of the structure shown in FIG. 10a;

FIG. 10c illustrates cross sectional views of integrated circuit chips suitable for placement in the cavities 105 formed in the substrate 93 of FIG. 10a;

DETAILED DESCRIPTION OF THE PREFERRED EMBODIMENTS

The following detailed description is meant to be illustrative only and not limiting. Other embodiments of this invention will be apparent to those of ordinary skill in the art in view of this disclosure. The terms "integrated circuit" and "integrated circuits" are used in this specification to mean "integrated circuit chip" and "integrated circuit chips" respectively.

Figure 1:
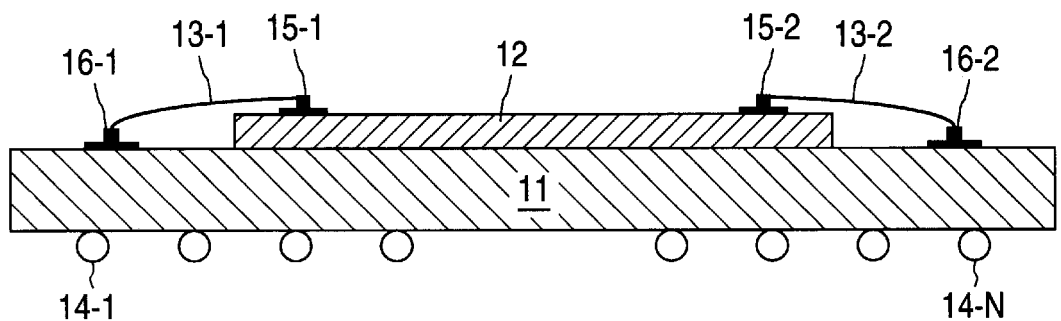
FIG. 1 shows in cross-section a ball grid array substrate 11 together with an integrated circuit chip 12 mounted thereon along with the wire bonds and lead conductive balls associated with the ball grid array package to interconnect the integrated circuit chip to external circuitry.

FIG. 1 illustrates in cross section a portion of a ball grid array package. Substrate 11 has placed on its top surface an integrated circuit chip 12, typically silicon. Electrically conductive wires 13-1, 13-2 are used to electrically connect conductive pads 15-1 and 15-2, respectively, on the integrated circuit 12 to conductive pads 16-1 and 16-2, respectively, formed on the top surface of substrate 11. Lead solder balls 14-1 through 14-N are formed on the bottom surface of the ball grid array substrate 11 to allow the ball grid array package to be electrically connected through conductive traces on a substrate such as a printed circuit board, to circuitry external to the package. The electrically conductive pads 16-1 and 16-2 are electrically connected to corresponding electrically conductive lead balls 14 on the bottom surface of ball grid array 11. This package utilizes wire bonding to adherently connect one end of wire 13-1, for example, to bonding pad 15-1 on the periphery of integrated circuit chip 12 and the other end of conductive wire 13-1 to conductive pad 16-1 on the inner surface of ball grid array substrate 11. Similarly, bonding wire 13-2 is adherently connected to bonding pad 15-2 on chip 12 and conductive pad 16-2 on the top surface of substrate 11. The structure shown in FIG. 1 is well known in the prior art. To form the electrical connection between the bonding pads 15 and conductive pads 16, electrically conductive wires, typically of gold, must be attached to bonding pads 15 and conductive pads 16 typically by ultrasonic or thermo compression bonding. This places pressure on bonding pads 15 and requires that bonding pads 15 be placed other than over the active circuitry of chip 12 to prevent damage to the circuitry during the bonding operation. This requires chip 12 to be larger in lateral dimensions than would otherwise be required to ensure that bonding pads 15 are not formed over any of the active circuitry in the chip.

Figure 2:
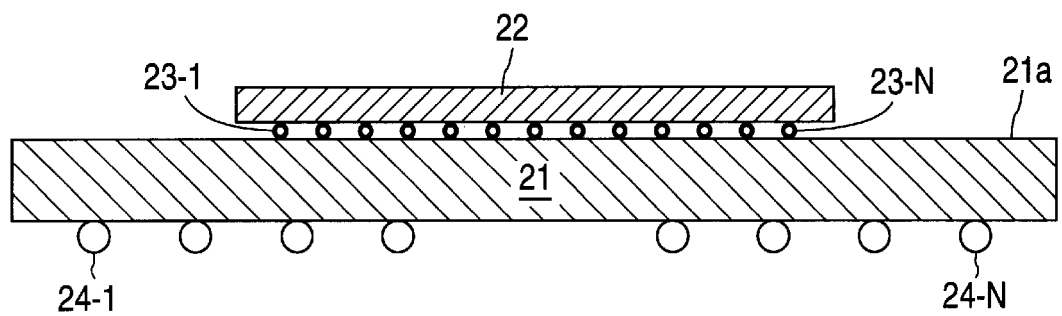
FIG. 2 shows in cross-section a ball grid array package 21 together with an integrated circuit chip 22 formed thereon using solder bumps and flip chip technology.

FIG. 2 shows the package of FIG. 1 wherein the substrate 21 has placed thereon an integrated circuit chip 22 using flip chip technology. Solder bumps 23-1 through 23-N are used to electrically connect integrated circuit chip 22 to conductive traces (not shown) on the top surface 21a of substrate 21. Unfortunately, because the solder bumps 23-1 through 23-N are on the bottom side of chip 22, visual inspection of the quality of the connections between these solder bumps and the underlying traces on substrate 21 is impossible. The technology to place chip 22 correctly on the traces on substrate 21 is quite complex and expensive. Moreover, the yield can suffer if the chip 22 is misplaced on the substrate 21.

Lead solder balls 24-1 through 24-N are formed on the bottom surface of substrate 21 just as shown on the bottom surface of substrate 11 in FIG. 1.

Figure 3:
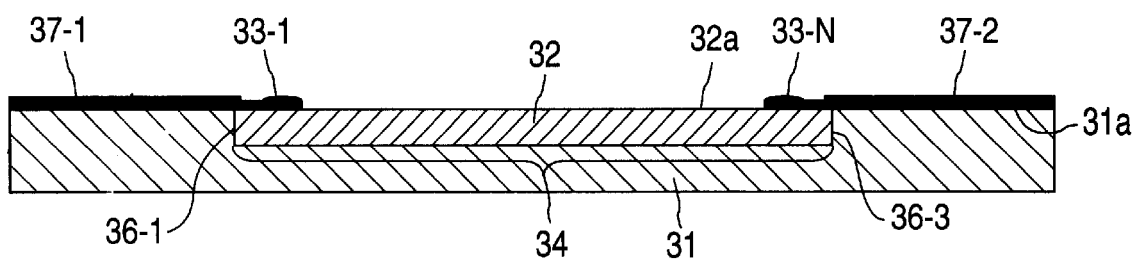
FIG. 3 shows in cross-section a structure in accordance with this invention wherein a ball grid array substrate 31 is shown possessing a cavity 34 containing an integrated circuit 32 with bonding pads 33 on the top side of the integrated circuit 32.

FIG. 3 shows a cross-sectional view of a substrate 31 containing therein in accordance with this invention a cavity 34 with substantially vertical sidewalls 36-1 and 36-3 in which has been placed an integrated circuit chip 32 such that the bonding pads 33-1 through 33-N face outward from the cavity and are visible. Integrated circuit chip 32 may be held in cavity 34 by adhesive epoxy of a type well-known. Bonding pads 33-1 through 33-N are on a surface which is substantially coplanar with the top surface 31a of substrate 31. Electrically conductive layer 37 (of which sections 37-1 and 37-2 are shown) is deposited over the top surface 31a of substrate 31 and over the top surface 32a of semiconductor chip 32. Typically, conductive layer 37 is substantially copper although other electrically conductive metals and materials such as aluminum, an aluminum silicon alloy, or a conductive silicide can also be used if desired.

Standard photolithographic processing techniques well known in the printed circuit board industry or the semiconductor industry are then used to mask and etch the conductive layer 37 to form layer 37 into electrically conductive traces which adhere to the top surface 31a of substrate 31 and to the top surface 32a of chip 32, as well as make electrical contact to selected ones of pads 33-1 through 33-N. These conductive traces then interconnect integrated circuit chip 32 into an electronic system including one or more integrated circuit chips similarly placed in cavities on either substrate 31 or on other similar substrates.

The entire structure can then be covered with a passivation layer such as a polymer or other dielectric material (such as polyimide) to protect the underlying circuitry.

Figure 4:
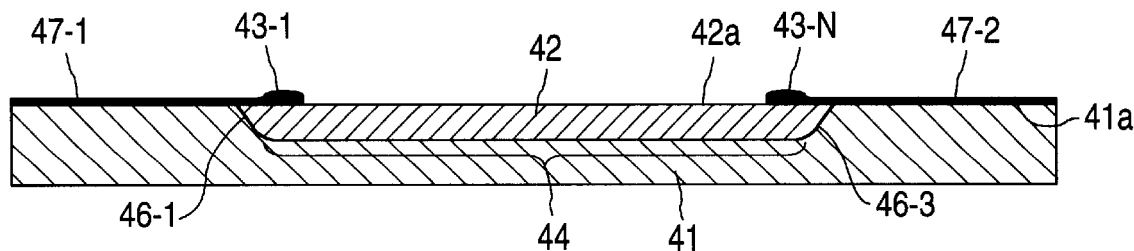
FIG. 4 shows in cross-section a ball grid array substrate 41 with a cavity 44 containing an integrated circuit chip 42 together with bonding pads 43 on the top surface of the integrated circuit chip 42 to allow the integrated circuit chip to be electrically interconnected into a system containing other integrated circuit chips.

FIG. 4 illustrates a structure much like FIG. 3 which includes a ball grid array substrate 41 of a selected material, such as a plastic or ceramic, in which a cavity 44 has been formed. The sidewalls 46-1 through 46-4 (of which sidewalls 46-1 and 46-3 are shown) are tapered, that is, form an angle with the vertical. Placed in cavity 44 is an integrated circuit chip 42 (which can be of silicon or gallium-arsenide, for example) with conductive pads 43-1 through 43-N facing outward from cavity 44. Upon top surface 41a of substrate 41 is formed an electrically conductive metal layer 47 of which sections 47-1 and 47-2 are shown. Metal layer 47 also is formed over the top surface 42a of integrated circuit chip 42 so as to cover the bonding pads 43-1 through 43-N. Conductive metal layer 47, typically copper, is then masked using a photoresist, the photoresist is patterned and the exposed portions of the conductive layer 47 are removed, typically by etching. The etching can be either wet or dry depending upon the feature sizes desired. Upon conclusion of the etching, the photoresist is typically removed and the resulting structure includes an electrically conductive interconnect structure formed from material 47 over the top surfaces 41a and 42a of the substrate 41 and the integrated circuit chip 42, respectively. The conductive interconnect structure interconnects chip 42 with other chips similarly placed in cavities on substrate 41 so as to form a complete electrical circuit or, if no other chips are present on substrate 41, is connected to other traces and external leads of the substrate so as to form an integrated circuit package for chip 42.

If desired, a passivation layer, such as a polymer or other dielectric (such as polyimide), can be placed over the top surface of the structure to passivate the structure. Electrical contact to the underlying circuitry can be made using any one of a number of techniques. One such technique involves forming conductive vias through the passivation layer as in the formation of multilayer interconnect structures.

The photolithographic techniques used to fabricate the monolithic, integrated structures of this invention are all well known in the printed circuit board and semiconductor processing arts.

Figure 5A:
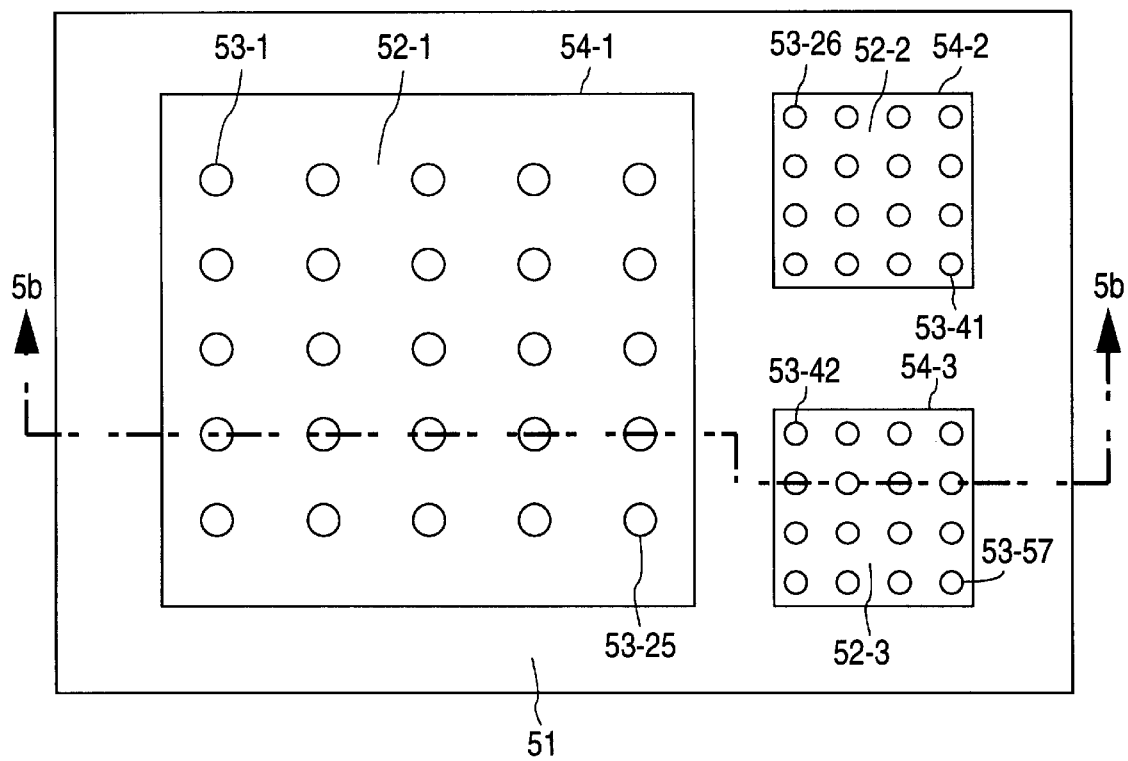
FIGS. 5a and 5b show a substrate 51 containing three integrated circuit chips 52-1 to 52-3 of different sizes placed in correspondingly sized cavities 54-1 to 54-3, respectively, on the substrate 51 with bonding pads 53 facing outward from each cavity, thereby to allow a conductive layer to be placed over the bonding pads 53 on the integrated circuit chips 52, masked and patterned to form electrically conductive leads between the integrated circuit chips 52-1 to 52-3.
Figure 5B:
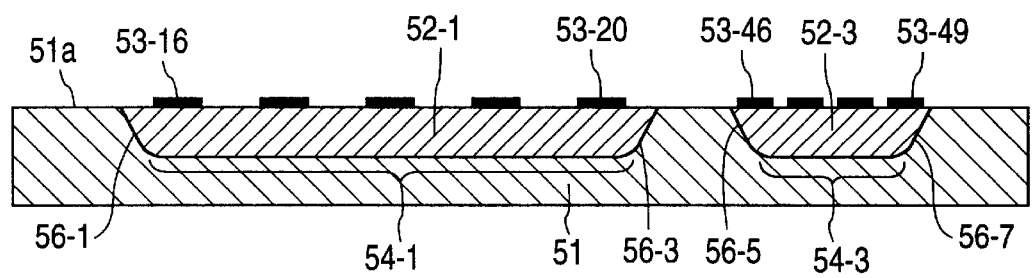
Figure 5C:
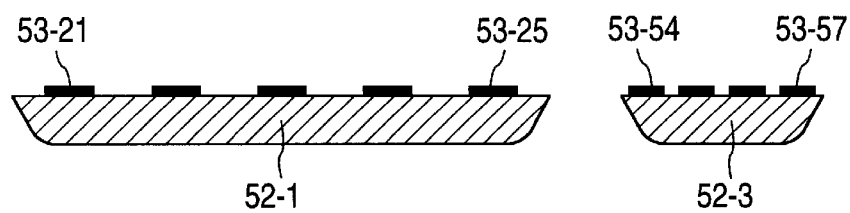
FIG. 5c shows in cross-section the integrated circuit chips 52-1 and 52-3 to be inserted into cavities 54-1 and 54-3, respectively, in substrate 51 shown in FIGS. 5a and 5b.

FIGS. 5a and 5b illustrate a plan and cross-sectional side view of a monolithic, integrated structure of this invention, while FIG. 5c shows a side view of semiconductor chips to be used in the structure of FIGS. 5a and 5b.

Substrate 51 (FIG. 5a) has formed therein three cavities 54-1, 54-2 and 54-3 in which are placed integrated circuit chips 52-1, 52-2 and 52-3, respectively. Cavity 54-1 contains integrated circuit chip 52-1 and cavity 54-2 contains integrated circuit chip 52-2. Cavity 54-3, shown along with cavity 54-1 in cross-sectional view in FIG. 5b, contains integrated circuit chip 52-3.

As shown in the plan view of FIG. 5a, integrated circuit chip 52-1 has twenty-five bonding pads formed on its top surface. Of interest, up to all of these bonding pads are formed over the active circuitry of the chip to thereby reduce the size of the chip compared to a prior art chip with the same number of bonding pads all located on the periphery.

Chip 52-2 and chip 52-3 are shown in cavities 54-2 (shown only in plan view in FIG. 5a) and 54-3 (shown in both FIGS. 5a and 5b), respectively. As a feature of this embodiment, the sidewalls 56-1 through 56-4 (of which only sidewalls 56-1 and 56-3 are shown) of cavity 54-1 are tapered (i.e., form an angle with the vertical to the surface 51a of substrate 51). Similarly, sidewalls 56-5 through 56-8 (of which only sidewalls 56-5 and 56-7 are shown) are likewise angled with respect to the vertical to the surface 51a of substrate 51 such the dimensions of the tops of the cavities 54 are larger than the dimensions of the bottoms of the cavities 54. Integrated circuit chips 52-1 and 52-3, as well as integrated circuit chip 52-2, have their sides angled by being scored with a scoring tool which has an angled cutting blade or by anisotropic etching. The wafers containing chips 52-1, 52-2 and 52-3 can also be sawed or singulated by anisotropic etching. Thus chips are produced with angled sides. The chips with the angled sides fit snuggly within the cavities 54-1 through 54-3 and are adherently held within these cavities typically by use of either an epoxy or an adhesive.

FIG. 5c shows in cross section the integrated circuit chips 52-1 and 52-3 to be placed respectively in cavities 54-1 and 54-3 in FIG. 5b. Of particular importance, bonding pads 53-16 through 53-20 and 53-46 through 53-49 are shown in FIG. 5b to be in essentially the same plane as top surface 51a. This allows an electrically conductive layer (not shown) to be formed over the top surface of substrate 51 and exposed surfaces, including conductive lands, of integrated circuit chips 52-1 through 52-3. The conductive layer, typically copper, is then masked with photoresist, the photoresist patterned, the exposed portions of the conductive layer removed, and then the remaining photoresist masking material is typically removed. The result is an electrically conductive pattern (not shown) interconnecting the bonding pads 53 on top of the integrated circuit chips 52 to form these chips into a desired electronic system.

Figure 6A:
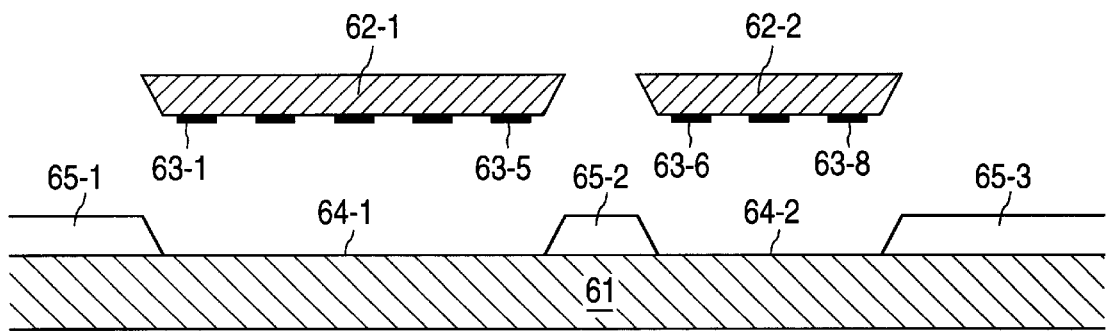
FIGS. 6a through 6c illustrate one method for fabricating the structure of this invention.
Figure 6B:
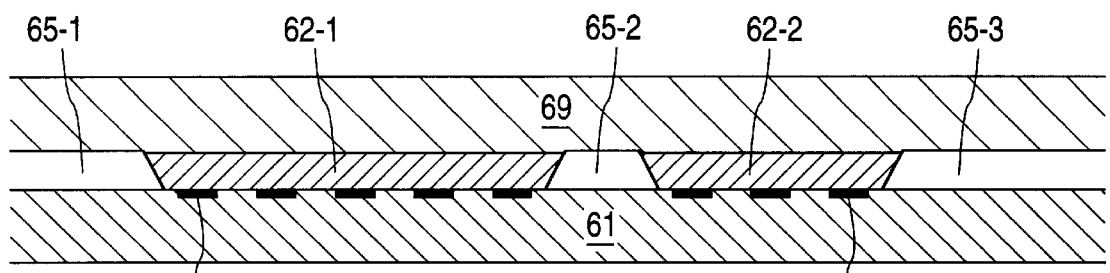
Figure 6C:
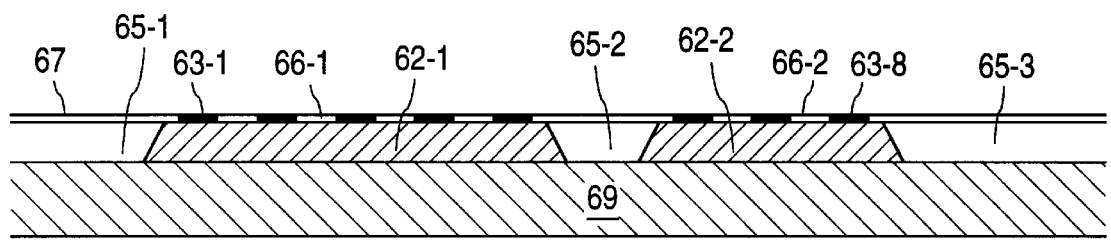

As shown in an alternative embodiment illustrated by FIGS. 6a through 6c, integrated circuit chips 62-1 and 62-2 can be placed in cavities 64-1 and 64-2 formed in a substrate material 65 (of which cross sections 65-1, 65-2 and 65-3 are shown) which in turn is formed on planarizing layer 61. A layer of soft, non-sticking film, such as but not limited to Teflon, can be coated on the surface of planarizing layer 61 adjacent to substrate 65. In FIG. 6b, the integrated circuit chips 62-1 and 62-2 have been placed in cavities 64-1 and 64-2, respectively, with the bonding pads 63-1 through 63-8 face down on the bottom of the cavities and against the top surface of planarizing layer 61. Underlying material 61 or the soft coating on layer 61, is in direct contact with these bonding pads 63. Prepreg layer 69 is then placed over the whole structure and prepreg layer 69 is laminated under heat and pressure to the underlying substrate 65 and chips 621 and 62-2. The structure is then flipped over as shown in FIG. 6c and the planarizing layer 61 is removed. The result is to leave a structure with prepreg layer 69 a permanent part thereof and with the top surfaces 66-1 and 66-2 of chips 62-1 and 62-2, respectively, exposed such that bonding pads 63-1 through 63-8 are visible. An electrically conductive layer 67 is then formed over the top surfaces (including bonding pads 63-1 through 63-8), of both the substrate 65 and the integrated circuit chips 62. The conductive layer, typically copper, is then masked, the mask is patterned, and the exposed conductive material resulting from the patterning of the mask is removed typically by etching (either wet or dry). The resulting structure includes an electrically conductive interconnect structure interconnecting the conductive pads 63 on the integrated circuit chips 62 to form a desired electrical circuit.

Figure 7A:
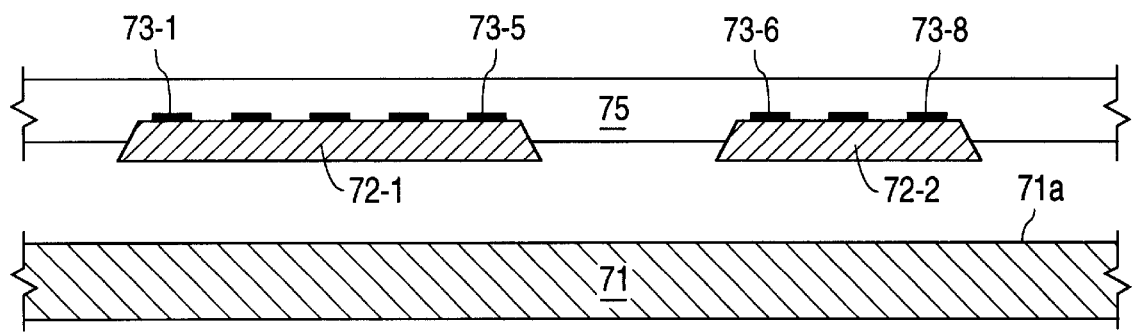
FIGS. 7a through 7d illustrate a second method for fabricating the structure of this invention.

FIGS. 7a through 7d illustrate an additional embodiment of this invention involving a template 75 which holds the integrated circuit die 72-1 and 72-2. Template 75 is shown in FIG. 7a to be held above a substrate 71 into which integrated circuit chips 72-1 and 72-2 are to be inserted.

Figure 7B:
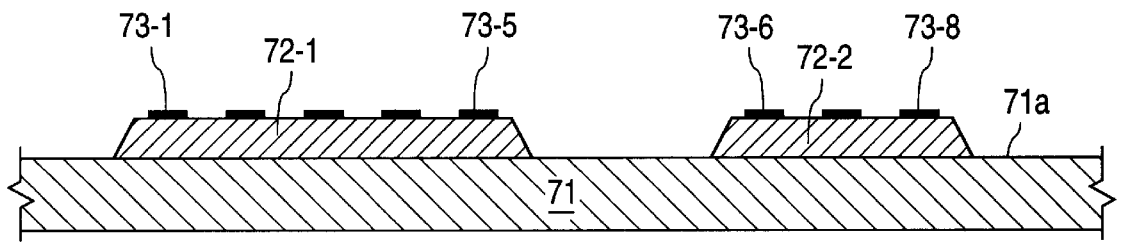

FIG. 7b shows semiconductor chips 72-1 and 72-2 placed on the top surface of substrate 71.

Figure 7C:
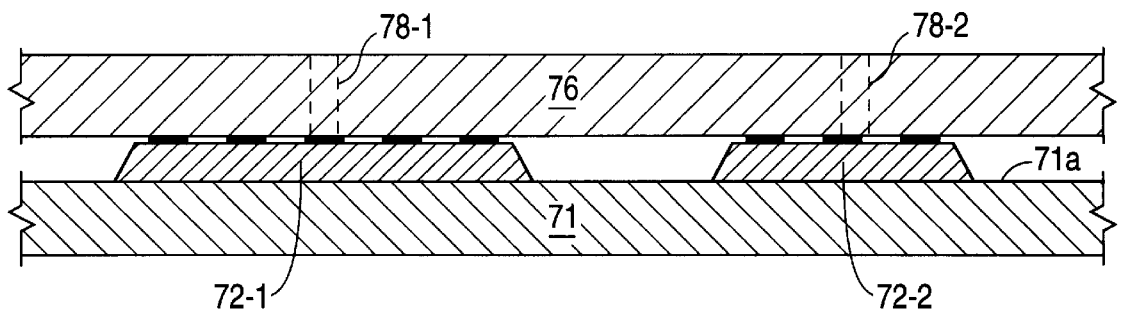
Figure 7D:
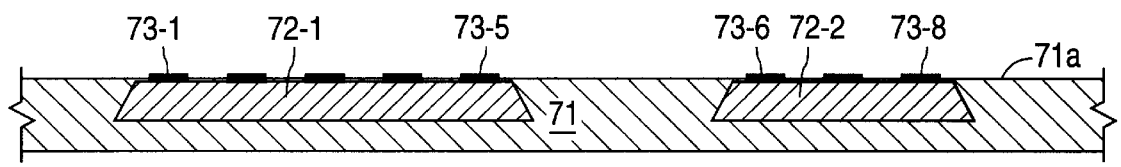

In FIG. 7c, a flat planarizing plate 76 is next pressed against the top surfaces of integrated circuit chips 72-1 and 72-2 which rest on top surface 71a of substrate 71. As an alternative embodiment, plastic substrate 71 may have cavities located on its top surface that match the location of components held in the template, and whose openings are the same size as or slightly larger-sized than the dimensions of the bottoms of components 72-1 and 72-2, such that the components 72-1 and 72-2 fit into the cavities. The depth of the cavities may equal the thickness of components 72-1 and 72-2, or the cavities may be of a lesser or greater depth. As shown in FIG. 7c, planarizing plate 76 presses against the tops of integrated circuit chips 72-1 and 72-2. While planarizing plate 76 is shown in FIG. 7c to be solid, an alternative embodiment provides openings (shown by dashed lines as openings 78-1 and 78-2) through planarizing plate 76 to allow a vacuum to be pulled through planarizing plate 76 to hold chips 72-1 and 72-2 in place during the subsequent process steps to which the structure is subjected. Alternatively, an adhesive can be placed on the bottom surface of planarizing plate 76 to hold the integrated circuit chips, such as chips 72-1 and 72-2, in place during the subsequent process steps. A cleaning step can then be employed to remove any portions of the adhesive on the top surfaces of the substrate 71 and integrated circuit chips such as 72-1 and 72-2 upon completion of the processing steps involving planarizing plate 76. Substrate 71 is then heated and pressure is applied through planarizing plate 76 (typically of steel, quartz or some other appropriate high-temperature flat material) to press chips 72-1 and 72-2 into the material of substrate 71 as this material softens due to the increased temperature. Alternatively, heat may be applied through planarizing plate 76, instead of, or in addition to, applying heat to substrate 71. Temperatures and pressures used for this process will vary depending on the choice of plastics used. A vacuum may be drawn on the substrate 71 during the subsequent processing to remove trapped gasses and air, and prevent voids from occurring within substrate 71. Those skilled in the arts will be familiar with vacuum presses in the printed circuit industry that are used for this purpose. In FIG. 7d, chips 72-1 and 72-2 are shown placed substantially into the material of substrate 71 such that the bonding pads 73-1 through 73-8 are in substantially the same plane as the top surface 71 a of substrate 71. Consequently, chips 72-1 and 72-2 are firmly held in the material of substrate 71. Of importance, the temperature to which substrate 71 can be heated must be held beneath the temperature at which the materials on the integrated circuit chips 72-1 and 72-2 deform or beneath the temperature at which the characteristics of the integrated circuits formed in chips 72-1 and 72-2 change.

Figure 8A:
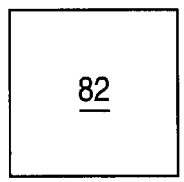
FIGS. 8a and 8b show, respectively, a multi-chip module and a substrate shaped like a semiconductor wafer capable of containing twenty-four multi-chip modules of a type shown in FIG. 8a but amenable to standard semiconductor photolithographic processing techniques in accordance with this invention.
Figure 8B:
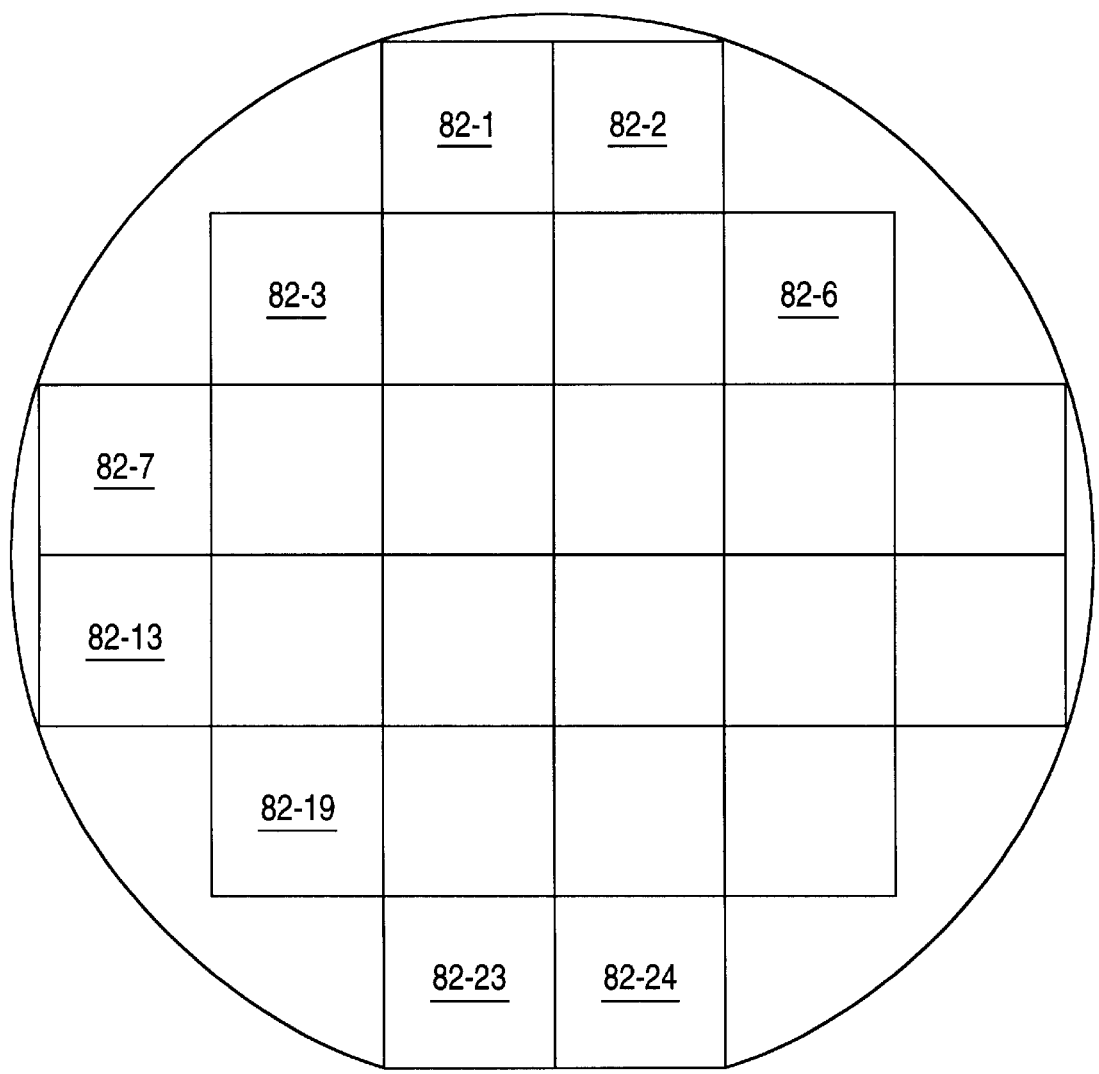

FIG. 8a illustrates a multi-chip module of this invention created by any of the processes described, for example, in FIGS. 5, 6 or 7 as part of a structure as shown in FIG. 8b specifically shaped to simulate a silicon wafer. This enables the integrated circuits formed as part of the described structure to be interconnected using semiconductor equipment of a type commonly available in semiconductor wafer fabrication facilities.

FIG. 8b illustrates a composite structure of this invention of the type which can be fabricated using semiconductor equipment available at semiconductor wafer fabrication facilities. As shown in FIG. 8a, a multi-chip module of the type commonly used today is about 30 millimeters on a side. Obviously, different size and shape multi-chip modules can be fabricated using the processes of this invention, but for the purpose of illustrating this invention, the multi-chip module shown in FIG. 8a as a square is particularly convenient. The structure and process of this invention allow a plurality of multi-chip modules 82-1 through 82-24 to be fabricated in a single "circular substrate" or "wafer" of multi-chip modules. Each module 82-1 through 82-24 can contain either an identical circuit or a different circuit. The structure shown in FIG. 8b can be processed using standard semiconductor processing equipment and standard semiconductor photolithographic processes. Each module 82-1 through 82-24 can represent and hold a plurality of semiconductor die such that each module 82-1 through 82-24 can implement a selected complex electrical system. Of course, structures 82 can be rectangular if desired and can be different sizes if desired thereby changing the number of such structures which can be fabricated in a given size substantially circular substrate or "wafer."

Following the fabrication of the twenty-four multi-chip modules as shown in FIG. 8b, this structure can be scored or sawed to singulate the multi-chip modules, thereby allowing each module 82 to be used in a separate electronic system, if desired. The processing of the "wafer" containing each of the modules can be done as described above in conjunction with each of FIGS. 3 through 7. Typically, an electrically conductive material such as copper is formed over the top surface of the structure. Photoresist is then placed over the top surface, patterned in a well known manner, and the resulting exposed conductive material is then removed by wet or dry etching to leave conductive patterns of material on each of the multi-chip modules 82-1 through 82-24. The resulting structure can then be passivated or additional conductive layers can be placed on insulation over the underlying conductive layers to allow multi-level conductive patterns to be implemented on each multi-chip module.

Figure 9:
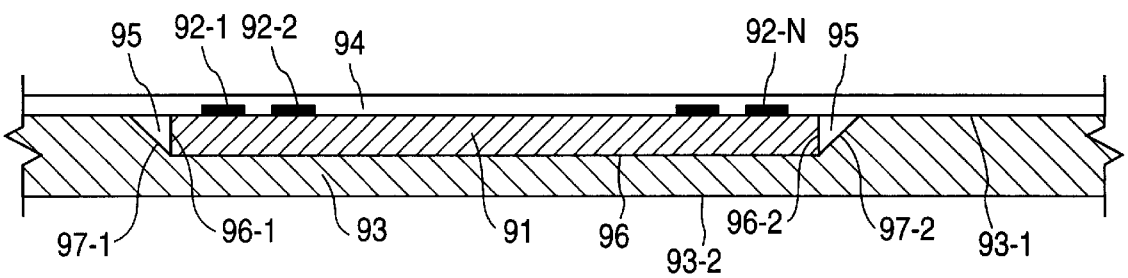
FIG. 9 shows a cross section of a substrate 93 containing a cavity 95 formed therein with an integrated circuit 91 (shown as a DRAM) placed in the cavity and a conductive routing layer 94 placed on top of both the integrated circuit 91 and the substrate 93.

FIG. 9 shows a cross sectional view of a substrate 93 containing therein an integrated circuit 91 (for example a DRAM, but which can be any other type of memory, analog circuit or integrated circuit such as a micro-controller, micro-processor or logic circuit) placed in cavity 95. Cavity 95 is shown in cross sectional view as having tapered sides 97-1 and 97-2. Cavity 95 has four sides all of which would be tapered as shown by the two tapered sides 97-1 and 97-2. Alternatively, cavity 95 can have only two or three sides tapered as shown by the two tapered sides 97-1 and 97-2 with the remaining sides or side being essentially vertical or a substantially different angle relative to the top surface of the integrated circuit chip and the substrate. The advantage of having one side vertical is that the integrated circuit chip then can be placed in the cavity in only one way thereby preventing erroneous placement of an integrated circuit chip in the cavity.

Integrated circuit 91 is held in the cavity using an epoxy glue or other suitable adhesive material spread along interface 96 between integrated circuit 91 and the substrate 93 to hold integrated circuit 91 in cavity 95. The integrated circuit 91 is shown to have straight, vertically-oriented, non-tapered sides of which sides 96-1 and 96-2 are shown. The void between slanted side 97-1 and vertical side 96-1, for example, or between vertical side 96-2 and tapered side 97-2, for example, is filled with a deposited epoxy or other appropriate filler material. Typically this filler material is not electrically conductive.

Electrically conductive layer 94 (also sometimes called a routing layer) is then deposited on the top surface of the integrated circuit 91 as well as on the top surface 93-1 of substrate 93. Routing layer 94 covers electrically conductive pads 92-1 through 92-N (sometimes called "conductive pads" or "pads") formed on the exposed surface of integrated circuit 91 to allow electrical connection to be made to integrated circuit 91. The electrical connection to pad 92-1, for example, is made by the deposited layer 94 forming an electrically conductive adherent connection to conductive pad 92-1 following the formation of layer 94 (which typically can be formed by low temperature chemical vapor deposition, low temperature evaporation, sputtering, electroless plating or electroplating). Conductive layer 94 is masked with an appropriate masking material such as a photoresist which is patterned in a well known manner, and then etched (either a wet etch or a dry etch) to remove unwanted portions of layer 94. The resulting structure forms an electrically conductive interconnect to electrically connect each of conductive pads 92-1 through 92-N to other appropriate portions of the electrical circuitry which make-up part of substrate 93.

Figure 10A:
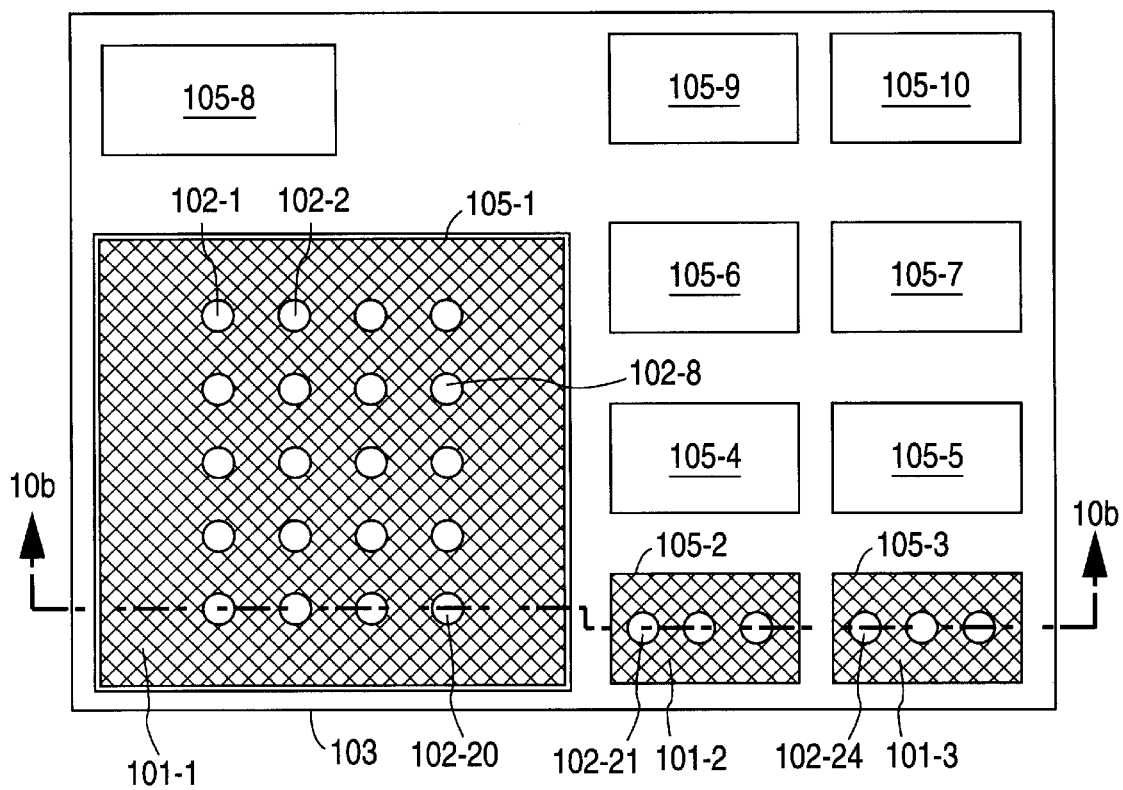
FIG. 10a shows a top plan view of substrate 103 containing a plurality of cavities 105 each capable of containing an integrated circuit chip.
Figure 10B:
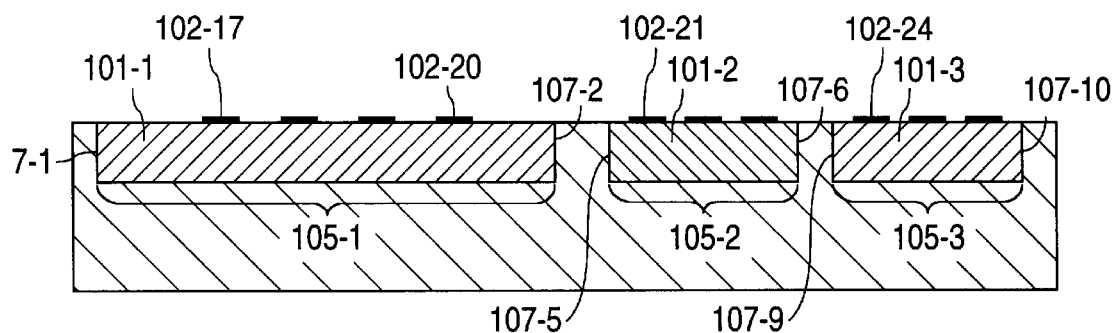

FIGS. 10a and 10b show additional structure in accordance with this invention. Substrate 103 contains a plurality of cavities 105-1 through 105-10 each with vertical sidewalls suitable for receiving an integrated circuit. Shown in plan view in FIG. 10a is an integrated circuit 101-1 which has output pads 102-1 through 102-20 formed on the exposed surface of the integrated circuit. Shown in cross sectional view in FIG. 10b, integrated circuit 101-1 is placed within cavity 105-1 such that what would normally be the top surface of the integrated circuit 101-1, if the integrated circuit 101-1 had been mounted conventionally on a substrate with conductive pads down, is placed on the bottom of the cavity 105-1 and the conductive pads 102-1 through 102-20 face outward and are readily visible on the top surface of the integrated circuit 101-1. Likewise, integrated circuits 101-2 and 101-3 are similarly placed in cavities 105-2 and 105-3 respectively. Epoxy glue (not shown) is used to firmly hold each component 101-1, 1012 and 101-3 in its respective cavity 105-1, 105-2 and 105-3. Alternatively, any other appropriate adhesive may be used.

The vertical side walls 107-1 through 107-10 of the cavities 105-1 through 105-3, respectively, are sized so as to allow integrated circuits 101-1 through 101-3 to fit snuggly within the cavities 105-1 through 105-3, respectively. To ensure that the integrated circuits 101-1 through 101-3 remain in these cavities 105-1 through 105-3, respectively, an adhesive such as epoxy glue is applied not only to the bottom of the cavity but also to the side walls of the cavity. The adhesive allows each cavity 105-1 through 105-10 to be slightly larger than the integrated circuit which would be placed in the cavity yet at the same time firmly hold the integrated circuit within the cavity.

Figure 10C:
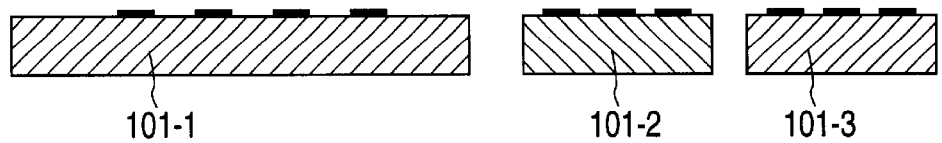

FIG. 10c shows a cross sectional view of the integrated circuits 101-1 through 101-3 which are placed in cavities 105-1 through 105-3 as shown in FIGS. 10a and 10b. The integrated circuits 101 can be memory, logic or analog circuits, or any other integrated circuits suitable for placement on a substrate to form an operational circuit. In addition, other components such as resistors, capacitors, LEDs, MEMs, photocouplers or switches, for example, can also be placed in appropriately sized cavities, if desired.

In FIG. 10a, cavities 105-4 through 105-10 are shown formed in the substrate 103. However, for simplicity, no integrated circuits are shown in these cavities although in practice each cavity within a substrate will receive an integrated circuit.

Figure 11A:
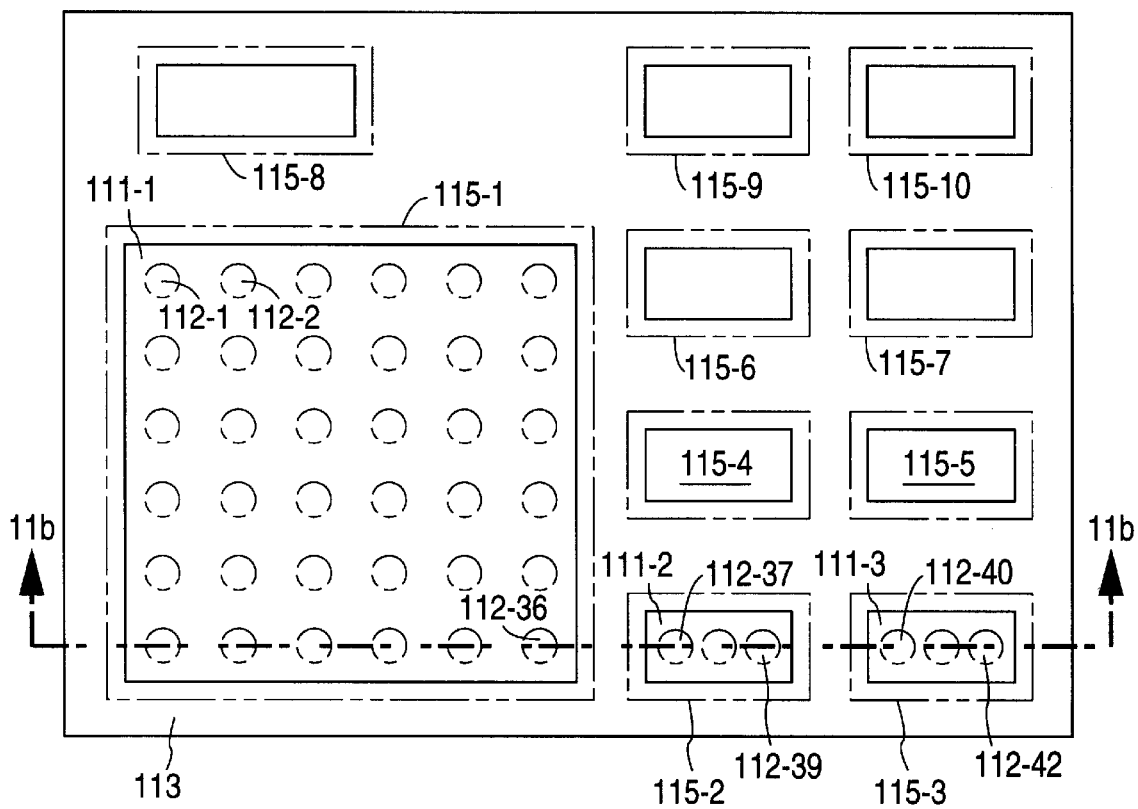
FIG. 11a shows a plan or top view of a substrate in accordance with this invention wherein the cavities 115 formed in the substrate for receipt of integrated circuit chips have tapered side walls 117.
Figure 11B:
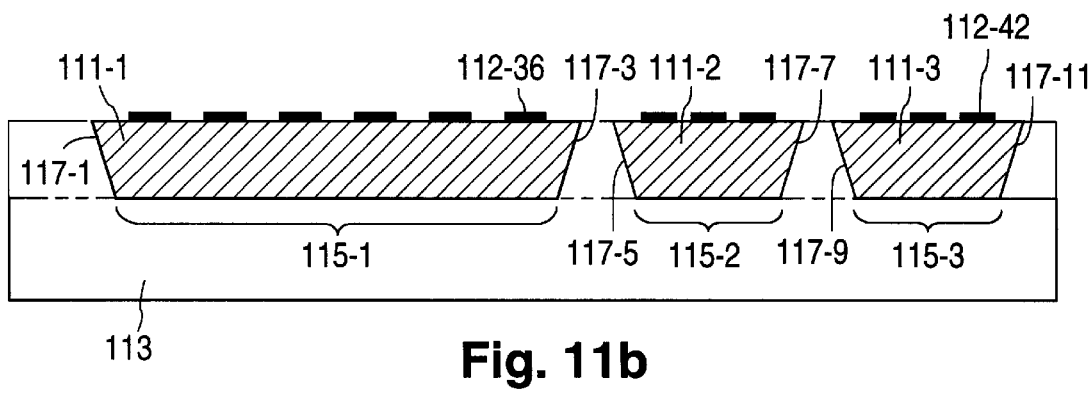
FIG. 11b shows a cross section of a portion of FIG. 11a illustrating the tapered side- walls associated with cavities 115 provided for receiving integrated circuits chips.
Figure 11C:
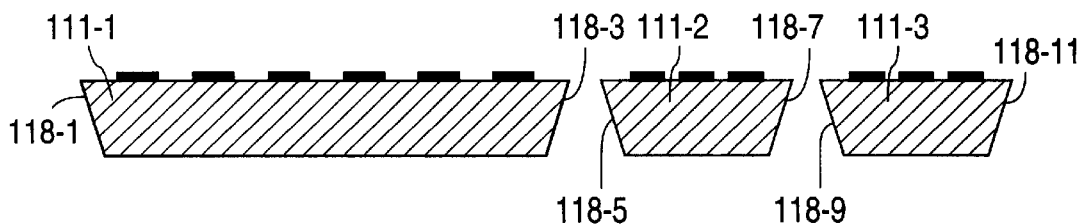
FIG. 11c shows integrated circuit chips with tapered sidewalls for insertion into the corresponding cavities 115 shown in FIGS. 11a and 11b.

FIGS. 11a and 11b show an alternative embodiment of this invention wherein cavities 115-1 through 115-10 are formed in much the same manner as the cavities 105-1 through 105-10 in FIG. 10a except the sides 117 (such as sides 117-1 through 117-4 associated with cavity 115-1 (only sides 117-1 and 117-3 are shown), sides 117-5 through 117-8 associated with cavity 115-2 (only sides 117-5 and 117-7 are shown), sides 117-9 through 117-12 associated with cavity 115-3 (only sides 117-9 and 117-11 are shown) and the corresponding sides associated with each of cavities 115-4 through 115-10) are tapered such that the top of each cavity 115 in the substrate 113 occupies a wider area than the bottom of each cavity 115 sunk part way into the substrate 113. The integrated circuits 111-1 through 111-3 likewise have tapered sides 118-1 through 118-12 which may or may not have a taper which matches the taper of the sides of the cavity. While preferably the tapers on the sides 118 of each integrated circuit 111 match the tapers on the sides 117 of the cavity 115 in which the integrated circuit is placed, this invention allows the tapers on the sides 118 of the integrated circuits 111 to differ from the tapers on the sides 117 of the receiving cavities 115 and still allow the integrated circuits 111 to be properly assembled in the underlying substrate or substrate 113. However, if the tapers on the sides 118 of the integrated circuits 111 match the tapers on the sides of the cavities 115 in which the integrated circuits 111 are to be inserted, then the integrated circuits 111 can be easily inserted into the corresponding cavities 115 and the tapered sides of each of the cavities 115-1 through 115-10 assist in properly aligning the integrated circuits 111 in their corresponding cavities 115. Conductive pads (of which pads 112-1 through 112-36 are shown associated with integrated circuit 111-1, pads 112-37 through 112-39 are shown associated with integrated circuit 111-2 and pads 112-40 through 112-42 are shown associated with integrated circuit 111-3) are formed on the exposed surfaces of the respective integrated circuits to allow a conductive layer to be deposited over the top surface of the structure including the exposed surfaces and pads of each integrated circuit 111 and the top surface of the substrate 113, patterned into conductive leads and then etched away to form electrically conductive leads connecting selected ones of pads 112 to other pads and/or to conductive traces or pads (not shown) on the substrate 113.

Figure 12A:
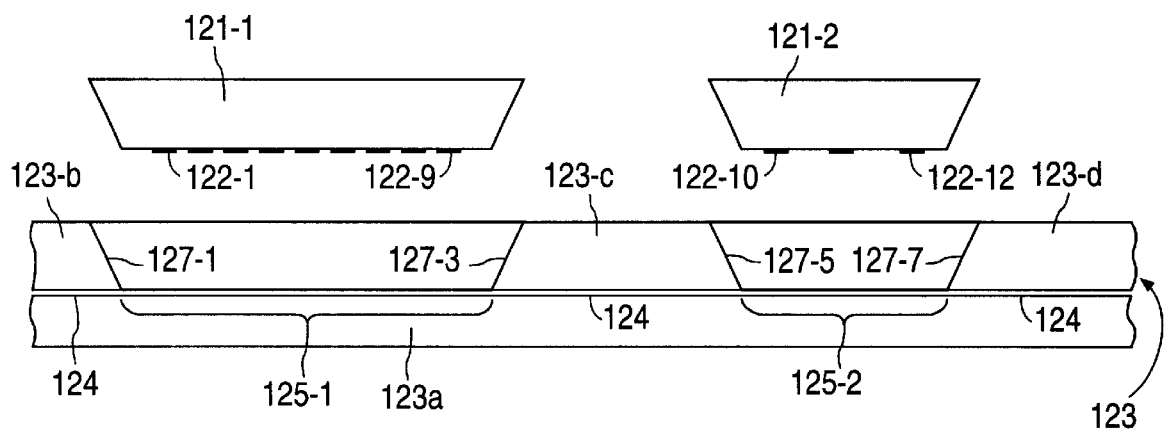
FIGS. 12a–12c illustrate various steps in the manufacture of a monolithic substrate containing at least one integrated circuit in accordance with this invention.
Figure 12B:
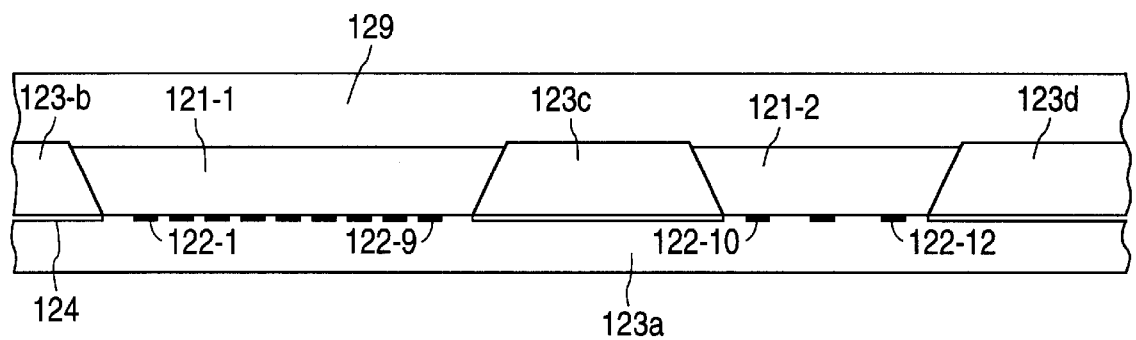
Figure 12C:
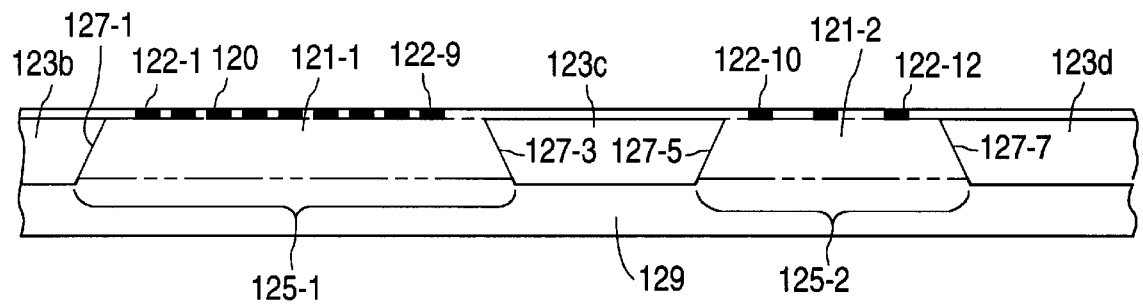

FIGS. 12a through 12c show an alternative embodiment for fabricating a substrate containing one or more integrated circuits 121 in accordance with this invention. A plastic substrate 123 (of which sections 123b, 123c and 123d are shown) is placed on a planarizing layer 123a which typically is sacrificial and is not part of the plastic substrate 123. The term plastic is used here and in the specification to include all types of plastic based materials including laminates formed using epoxy, BT, and cyanate resins strengthened with woven glass or aramid cloth, for example. Such materials are commonly used in the PCB industry and any laminate material of the type used in the PCB industry is appropriate for use in this invention. A metal layer 124 (typically copper) is formed on the bottom of substrate 123 between substrate 123 and planarizing layer 123a. As part of the fabrication process, cavities 125-1 and 125-2 must be formed in material 123 which makes up the substrate. This is done by any one of several processes, such as routing with a suitably tapered bit or molding, which results in tapered sidewalls 127-1 through 127-4 for cavity 125-1 and tapered sidewalls 127-5 through 127-8 for cavity 125-2 (of which only sidewalls 127-1, 127-3, 127-5 and 127-7 are shown). The resulting structure is shown in cross-section in FIG. 12a.

The integrated circuits 121-1 and 121-2 can then be placed in the cavities 125-1 and 125-2,-respectively, followed by the formation of a laminate layer 129, such as a well known prepreg layer, over the back sides of these inserted integrated circuits 121-1 and 121-2. Prepreg laminate layer 129 is applied under heat and pressure to attach to the portions 123b through 123d of plastic substrate 123 and to fill all crevices between the inserted integrated circuits 121-1 and 121-2 and the walls 127 of the cavities 125-1 and 125-2 in which integrated circuits 121 -1 and 121-2, respectively, are placed. Prepreg layer 129 firmly holds integrated circuit 121-1 and integrated circuit 121-2 in cavities 125-1 and 125-2, respectively.

Following this step, the structure looks somewhat as shown in FIG. 12b except the planarizing layer 123a still remains on the structure. Planarizing layer 123a can, for example, be stainless steel, quartz, or any other planar material which is capable of being removed from the structure prior to completion of the structure but after insertion of the integrated circuits 121 into the cavities 125 associated with the plastic substrate 123. Material 123, which makes up the plastic substrate, will be formed using a mold made of stainless steel, aluminum or other appropriate material, to create the substrate with cavities of which cavities 125-1 and 125-2 are shown with tapered side walls 127-1 through 127-8. Now, planarizing layer 123a is physically removed (planarizing layer 123a in one embodiment merely supports and is not permanently attached to plastic substrate material 123 and thus can be easily removed). As a result of removing planarizing layer 123a, the pads 122 on the bottom surfaces of integrated circuits 121-1 and 121-2 are exposed. Metal layer 124 is also exposed at this time. Conductive pads 122 (of which pads 122-1 through 122-9 are shown in FIG. 12a) have been formed on the bottom surface of integrated circuit 121-1 and conductive pads 122 (of which pads 122-10 through 122-12 are shown in FIG. 12a) have been formed on the bottom surface of integrated circuit 121-2. These electrically conductive pads 122 are at the bottoms of the cavities 125 and not yet accessible to conductive leads which are to be formed on the plastic substrate.

Metal layer 124 typically is copper although any other appropriate electrically conductive metal can also be used. The metal 124 can be placed on the bottom of the substrate 123 after the formation of the cavities 125 in the substrate material 123, or metal 124 can even be placed upon the bottom surface of the substrate 123 after placement of the integrated circuits 121 in the corresponding cavities 125. This latter alternative may require masking the exposed surfaces of each of the integrated circuits 121 to protect the conductive pads 122 exposed on the integrated circuits' surfaces from being contacted by metal layer 124 during the formation of metal layer 124. Alternatively, however, these pads 122 can be allowed to be contacted by the metal layer 124 and then a photolithographic process can be used to form the interconnects directly between pads 122 on one integrated circuit 121 and adjacent pads 122 on other integrated circuits 121 or electrically conductive traces on the substrate 123 as part of the final processing step to form the electrical interconnect structure associated with the substrate 123.

The substrate, now made up of those materials of which cross sections 123b, 123c, and 123d are shown and the laminate layer 129, is flipped over (as shown in FIG. 12c) such that pads 122-1 through 122-12 are exposed. An electrically conductive layer of material 120 (typically copper) is then formed over the top surfaces of both metal layer 124 and pads 122, patterned and etched to form electrically conductive leads uniquely linking each of pads 122 to a corresponding conductive pad on another integrated circuit or to a conductive trace (not shown) on the substrate 123. The laminate layer 129 now forms part of the substrate 123 and integrated circuits 121-1 and 121-2 are firmly mounted in the plastic substrate 123 and held in place by the prepreg laminate layer 129 which adheres to and forms around parts of the integrated circuits 121. The sloping sides 127 of cavities 125-1 and 125-2 (of which sides 127-1 and 127-3 are shown for cavity 125-1 and sides 127-5 and 127-7 are shown for cavity 125-2) also assist in holding integrated circuits 121 in place.

The integrated circuits shown in FIGS. 11a through 11c and 12a through 12c have tapered sides. The tapers can form angles with the vertical ranging between zero degrees to plus or minus forty-five degrees or even greater in the final structure depending on whether the top of the cavity in the finished structure is larger or smaller in dimensions than the bottom of the cavity. The use of tapered sides is not necessarily required and the invention likewise can use integrated circuits with vertical flat sides such that the integrated circuits will rest in a tapered cavity and be automatically aligned by the tapered sides of the cavity to properly fit within the cavity. The use of laminate layer 129 to then hold the integrated circuits with vertical sides in the appropriate tapered cavity ensures that the integrated circuits are properly aligned in each of their respective cavities. Of course, integrated circuits with vertical sidewalls can be placed in cavities with vertical sidewalls.

FIGS. 13a through 13d illustrate another method (using heat-softened material), of fabricating the monolithic substrate of this invention containing one or more integrated circuits.

Figure 13A:
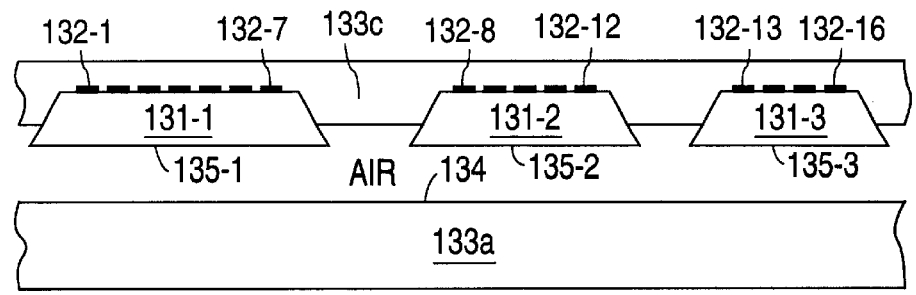
FIGS. 13a–13d illustrate an alternative method of fabricating a monolithic substrate containing one or more integrated circuit chips in accordance with this invention.
Figure 13B:
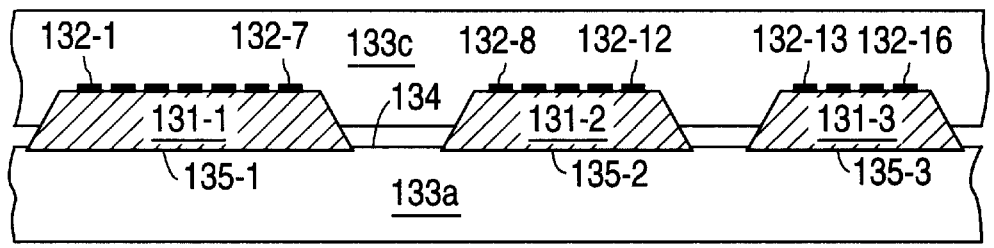

In FIG. 13a, a substrate 133a of thermo-plastic material, epoxy or other thermo-setting plastic is shown below integrated circuits 131-1, 131-2 and 131-3 held spaced above substrate 133a by a template 133c. Template 133c holds integrated circuits 131-1, 131-2 and 131-3 in place by vacuum, adhesive, or gravity if the structure comprising substrate 133a and template 133c is flipped 180° such that substrate 133a is on top and template 133c is on the bottom.

The integrated circuits 131-1, 131-2 and 131-3 may be held in place on substrate 133a by adhesive or by pressing integrated circuits 131-1, 131-2 and 131-3 slightly into the top surface 134 of substrate 133a at an elevated temperature sufficient to soften, make tacky and allow to flow the material of substrate 133a.

The backsides 135-1 through 135-3 of the integrated circuits 131-1 through 131-3, respectively, that are held in position by the template 133c are brought into contact with plastic substrate 133a. Thermoplastic materials such as Mylar, Melinex, Kaladex or Delrin may be used for this substrate 133a because they can be heated and cooled quickly, enabling rapid processing time. Thermoset materials or combinations of thermoset and thermoplastic materials may also be desirable. Template 133c can remain in position during curing, or the template 133c can position the integrated circuits 131-1 through 131-3 onto another structure that securely holds the components by a vacuum or adhesive in fixed positions during the subsequent processing after removal of template 133c.

Figure 13C:
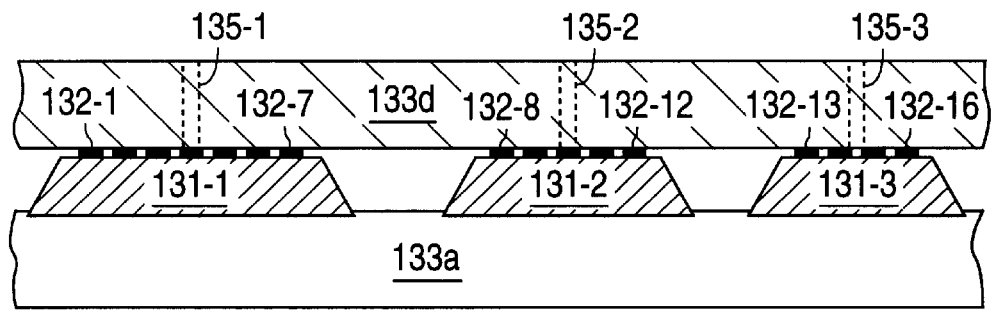

In FIG. 13c, a planar structure 133d (such as a stainless steel, aluminum or quartz plate) is placed on top of integrated circuits 131-1, 131-2 and 131-3, the entire structure is heated, and pressure is applied through the planar structure 133d to integrated circuits 131-1, 131-2 and 131-3. While planar structure 133d is shown in FIG. 13c to be solid, an alternative embodiment provides openings (135-1 through 135-3 shown by dashed lines) through planar structure 133d to allow a vacuum to be pulled through planar structure 133d to hold packages 131-1, 131-2, and 131-3 in place relative to planar structure 133d and substrate 133a during the subsequent process steps to which the structure is subjected. Alternatively, an adhesive can be placed on the lower surface of planar structure 133d contacting integrated circuits 131-1, 131-2 and 131-3 to hold the integrated circuits 131-1, 131-2 and 131-3 in place during the subsequent process steps. A cleaning step can then be employed to remove any residual adhesive from the top surface of substrate 133a and the exposed surfaces and pads of integrated circuits 131-1, 131-2 and 131-3 upon completion of the processing steps involving planar structure 133d.

Figure 13D:
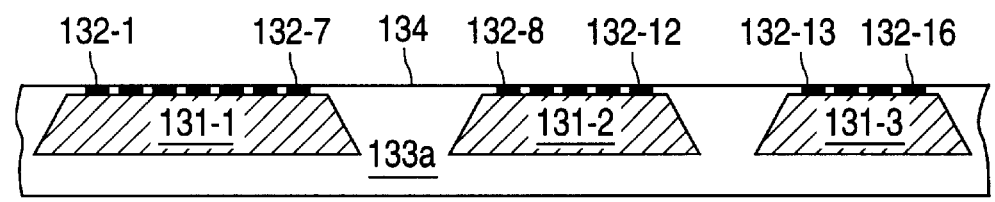

The surface of planar structure 133d in contact with the integrated circuits may be coated with a soft teflon film to protect the pad-carrying front side of the integrated circuits 131-1 through 131-3 and to ensure ease of separation of the planar structure 133d from the underlying composite structure of integrated circuits 131 and substrate 133a. If adhesive is used to hold integrated circuits in position during subsequent processing, this teflon film can be selectively applied, by stencil printing or other processes, so as not to coat the areas where an adhesive will be applied to hold in place the integrated circuits 131. The entire structure rests on a flat surface (not shown) during this operation. A heated press, such as those used in substrate manufacturing, is pressed against the plastic substrate 133a, and pressure is applied between the press and the planarizing layer 133d. A vacuum may be drawn on the substrate during the subsequent processing to remove trapped gasses and air, and prevent voids from occurring within the substrate. Those skilled in the arts will be familiar with vacuum presses in the substrate industry that are used for this purpose. The press is heated to allow the plastic to flow, and the substrate plastic forms around the integrated circuits 131-1 through 131-3 and is stopped by the planarizing layer 133d to create a composite structure with the substrate top surface 134 substantially coplanar with the top surfaces of the embedded integrated circuits 131-1 through 131-3. The temperatures and pressure used for this process will vary depending upon the choice of plastics. The press and the integrated substrate are returned to room temperature, permanently securing the integrated circuits 131-1 through 131-3 as part of the planar structure. As an alternative, heat and pressure can also be applied to the planarizing layer 133d instead of or in addition to the heat and pressure applied to the back of the plastic substrate 133a. The integrated circuits 131-1, 131-2 and 131-3 are then pressed into substrate 133a until the top surfaces of integrated circuits 131-1, 131-2 and 131-3 (which contain conductive pads 132 of which pads 132-1 through 132-7 on integrated circuit 131-1, pads 132-8 through 132-12 on integrated circuit 131-2 and pads 132-13 through 132-16 on integrated circuit 131-3 are shown) are essentially coplanar with the top surface 134 of substrate 133a. The final position of integrated circuits 131-1, 131-2 and 131-3 is shown in FIG. 13d where the top surfaces of integrated circuits 131-1, 131-2 and 131-3 are approximately coplanar with the top surface 134 of substrate 133a. Pads 132-1 through 132-16 are shown to have their top surfaces in a plane, which preferably is substantially coextensive with the top surface 134 of substrate 133a. Typically, a dielectric is formed between the pads on the top surfaces of integrated circuits 131-1 through 131-3 to protect any underlying circuitry (including electrically conductive traces) formed beneath the dielectric. The top surfaces of the pads 132 and the dielectric are substantially coplanar. Because substrate 133a is made of a thermoplastic material, epoxy or thermo-setting plastic, which will soften and flow at a temperature beneath the temperature at which the material of integrated circuits 131 softens, the final structure includes integrated circuits 131-1, 131-2 and 131-3 firmly embedded and held in the plastic material of substrate 133a. Substrate 133a is now ready for metalization to form electrically conductive interconnect routing or additional laminated or built-up structure on the top surface 134 of substrate 133a.

In this embodiment, the template 133c is the same lateral size as the plastic substrate 133a that will be used in the fabrication of the integrated structures. The template 133c may vary in thickness from a few thousandths of an inch to a quarter of an inch or more. Each template 133c is a unique design and contains openings that are designed to hold and correctly align matching-sized integrated circuits 131. Template 133c in one embodiment has openings with angled sidewalls which match the angled sidewalls of the integrated circuits 131 that will be held by the template. This insures correct XY alignment. Since the typical system to be formed using the structures and methods of this invention is much smaller in lateral dimensions than the full sized substrate 133a, a stepped and repeated pattern can be used to create a plurality of systems on each substrate 133a.

In an alternative embodiment, integrated circuits 131 are placed into their respective openings in the template 133c and are held in place by a vacuum drawn through holes (not shown) appropriately placed in template 133c above the integrated circuits 131, a temporary adhesive, or by gravity if the openings on the template 133c are positioned in the topside of template 133c. Well known pick and place equipment can be used to place the integrated circuits 131 in their respective openings in template 133c. The required sidewall angles of the integrated circuits 131 may be created by choosing a saw blade for singulating the integrated circuit chips with the angles on the sides of the cutting blade matching the angles of the sides of the openings in the template 133c, or by anisotropic etching of the silicon. Thus, the integrated circuit chips 131 will have sidewall angles that match the angles of the sidewalls of their respective template openings. The angles of the sidewalls relative to the vertical can vary between zero degrees to minus forty-five degrees or even greater in the finished structure as shown in FIG. 13d. (By minus forty-five degrees is meant that the bottom of a cavity is larger than the top opening of the cavity.) Of course the sidewall angles of the integrated circuit chips 131 could also vary between zero degrees to plus forty-five degrees or even greater in the finished structure if desired. However, the self-locking of the integrated circuits 131 in the substrate as shown in FIG. 13d would be absent because the bottoms of the integrated circuits 131 would not have larger dimensions than their tops.

As an alternative embodiment, not shown in the drawing, plastic substrate 133a may have cavities located on its top surface that are aligned to integrated circuits 131-1, 131-2, and 131-3, that are held in the template. The dimensions of these cavities are the same or slightly larger sized than the dimensions of the integrated circuit chip bottoms 135-1, 135-2 and 135-3, such that the integrated circuit chips fit into the cavities. The depths of the cavities may equal the thicknesses of integrated circuit chips 135-1, 135-2 and 135-3, or the cavities may be of a lesser or greater depth.

An alternative embodiment for accurately placing integrated circuits 131-1, 131-2 and 131-3 onto a substrate uses commercially available pick-and-place equipment, commonly used in surface mount assembly of integrated circuit chips (as described in the prior art). Integrated circuit chips 131-1, 131-2 and 131-3 are automatically placed onto plastic substrate 133a in specific locations according to a unique program that is created for each design. The surface of the plastic substrate 133a may have an adhesive applied, or it may be raised in temperature to make the surface tacky so as to hold in place the integrated circuits 131-1, 131-2 and 131-3.

An electrically conductive material, for example, a metal such as copper, is deposited over the entire, coplanar top surface 134 (FIG. 13*d*) of the integrated structure, coating the exposed surface of the original substrate 133a as well as the topsides and the bonding pads of the integrated circuits 131-1, 131-2 and 131-3. The metal may be plated or applied by other means such as sputtering or evaporation. A photosensitive material is then applied, the interconnect pattern is defined in a well-known manner and the conductive layer is etched to produce the desired electrically conductive interconnect pattern.

As an alternative embodiment for creating the structure shown in FIG. 13*d*, integrated circuits 131 can be accurately placed on substrate 133a using a template which is described above and shown in FIG. 13*a*. The integrated circuits are then held in place on substrate 133a by a planarizing layer 133d (FIG. 13*c*). A vacuum can be applied to integrated circuits 131-1 through 131-3 through holes 135-1 through 135-3 in planarizing layer 133d above the integrated circuits to hold the integrated circuits 131-1 through 131-3 in place. Alternatively, an adhesive can be applied to the bottom surface of planarizing layer 133d to hold integrated circuits 131-1 through 131-3 in place. The resulting structure is placed in an injection mold and heated plastic is injected into the injection mold (typically a custom mold sized to receive the substrate 133a with the planarizing layer 133d attached thereto) completely covering the backside and interstitial spaces of the structure with the injected plastic. In a further modification of this process, integrated circuits 131-1 through 131-3 are placed on substrate 133a by template 133c, template 133c is then removed and planarizing plate 133d is placed over and in contact with the exposed pad-containing surfaces of integrated circuits 131-1 through 131-3. Integrated circuits 131-1 through 131-3 are held in place relative to planarizing plate 133d by adhesive on the adjacent contacting surface of planarizing plate 133d or by vacuum drawn though openings 135-1 through 135-3 in planarizing plate 133d directly above the integrated circuits 131-1 through 131-3. Such a vacuum holds integrated circuits 131-1 through 131-3 in place relative to planarizing plate 133d. Planarizing plate 133d, with integrated circuits 131-1 through 131-3 attached, is then placed in an injection mold and heated plastic is injected into the mold to encapsulate the integrated circuits 131-1 through 131-3. The resulting structure is allowed to cool and planarizing plate or layer 133d is removed from the structure to expose the pads 132-1 through 132-16 on the outward facing surfaces of integrated circuits 131-1 through 131-3.

In an alternative embodiment, planarizing plate 133d can also be used as a template thereby eliminating the need for template 133c.

Figure 14A:
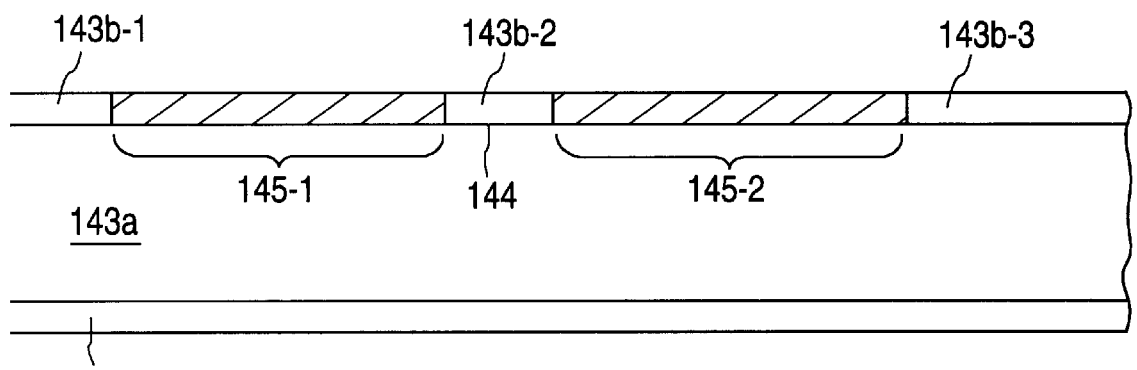
FIGS. 14a–14c illustrates a third method of fabricating a monolithic substrate containing at least one integrated circuit chip in accordance with this invention.
Figure 14B:
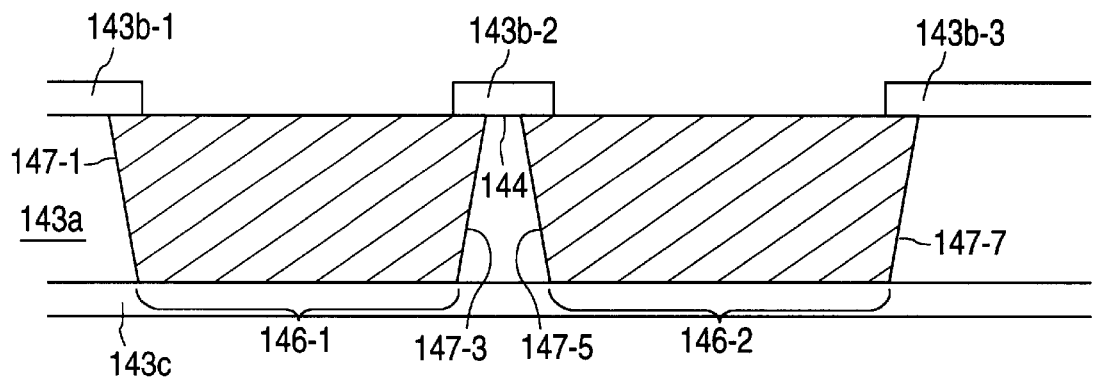
Figure 14C:
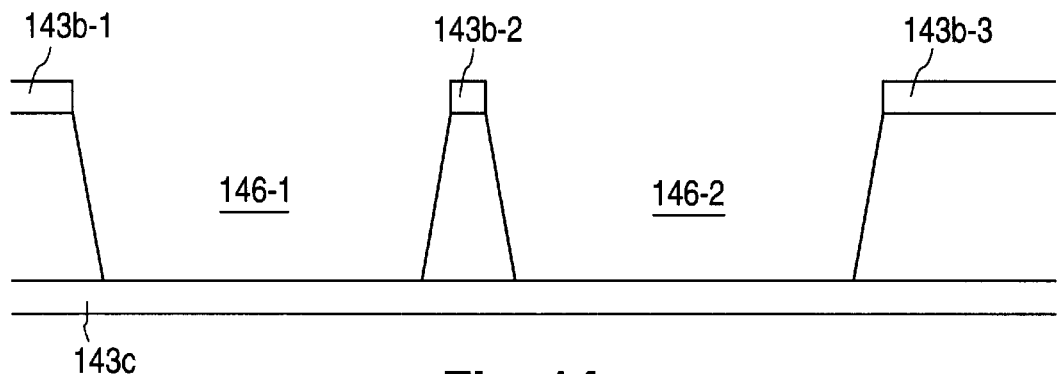

FIGS. 14*a*, 14*b* and 14*c* illustrate another alternative embodiment of this invention. A substrate 143a of metal has formed on its top surface 144 a layer of copper 143b. Copper 143b is then masked and etched to form openings 145-1 and 145-2 in copper layer 143b, thereby to create cavities in copper layer 143b between the cross sectional copper portions 143b-1, 143b-2 and 143b-3. A second copper layer 143c is formed on the bottom of metal layer 143a. Typically, metal layer 143a is aluminum.

In FIG. 14*b*, metal layer 143a is further etched through the openings 145-1 and 145-2 formed in copper layer 143b to form cavities 146-1 and 146-2 in the metal layer 143a. The copper layer 143b, of which cross sections 143b-1, 143b-2 and 143b-3 are shown, serves as an etch resistant mask. The etching through metal layer 143a automatically stops at the second copper layer 143c thereby to produce a controllable cavity depth equal to the thickness of metal layer 143a. Cavities 146-1 and 146-2 have slightly tapered sides 147-1 through 147-8 of which sides 147-1 and 147-3 are shown with respect to cavity 146-1 and sides 147-5 and 147-7 are shown with respect to cavity 146-2. Because of the lateral etching of the metal 143a, tapered sides 147-1 through 147-8 are formed during the etching process. Thus copper mask sections 143b-1 through 143b-3 are slightly undercut. Copper layer 143b can then be etched back to conform to metal 143a such that the etched cavities 146-1 and 146-2 each have an opening at the top corresponding to the maximum width of the cavities 146-1 and 146-2 in the metal layer 143a.

Finally, portions of copper layer 143c, which served as an etch stop mask, may be removed to produce through-hole cavities 146-1 and 146-2 or alternatively remain (as shown) as part of the final structure. The particular structure with copper layer 143c remaining, now shown in FIG. 14*c*, can be used in conjunction with integrated circuits to serve as a heat dissipation plane or to serve as an equal-potential plane such as a VCC plane or a ground plane.

Figure 15A:
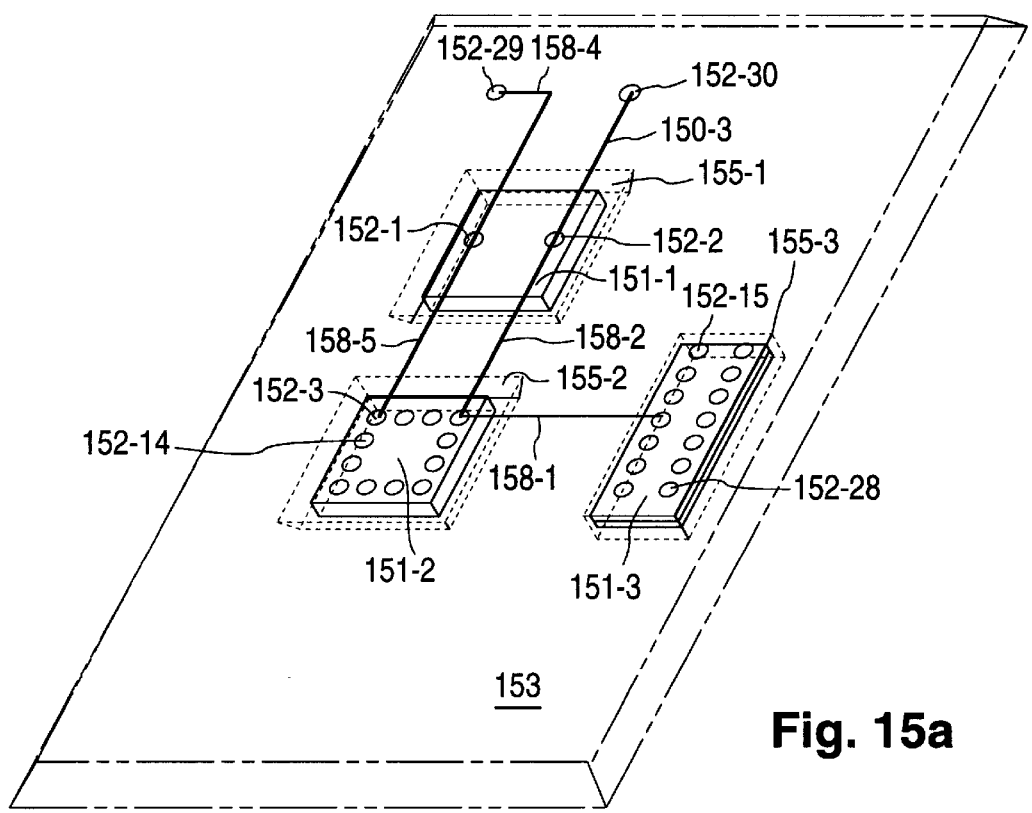
FIGS. 15a and 15b each show an isometric view of a monolithic substrate containing three integrated circuit chips in accordance with the principles of this invention.

FIG. 15*a* shows an isometric view of a substrate 153 having three cavities 155-1, 155-2 and 155-3 in which are placed three integrated circuits 151-1, 151-2 and 151-3, respectively. Pads 152-1 and 152-2 are shown on integrated circuit 151-1, pads 152-3 through 152-14 (counting clockwise) are shown on integrated circuit 151-2 and an additional fourteen pads 152-15 through 152-28 are shown on integrated circuit 151-3. Electrically conductive interconnects 158-1, 158-2, 158-3, 158-4 and 158-5 are shown interconnecting selected ones of the pads on the integrated circuits as well as conductive pads 152-29 and 152-30 on the substrate 153. As is apparent from the isometric view of FIG. 15*a*, this substrate 153 includes the integrated circuits 151-1 through 151-3 as a monolithic, integrated part thereof adherently attached to the cavities 155-1 through 155-3, respectively, in the substrate 153. The resulting structure is thinner than prior art structures and provides a monolithic, planar, integral structure, which is robust and of high quality.

Figure 15B:
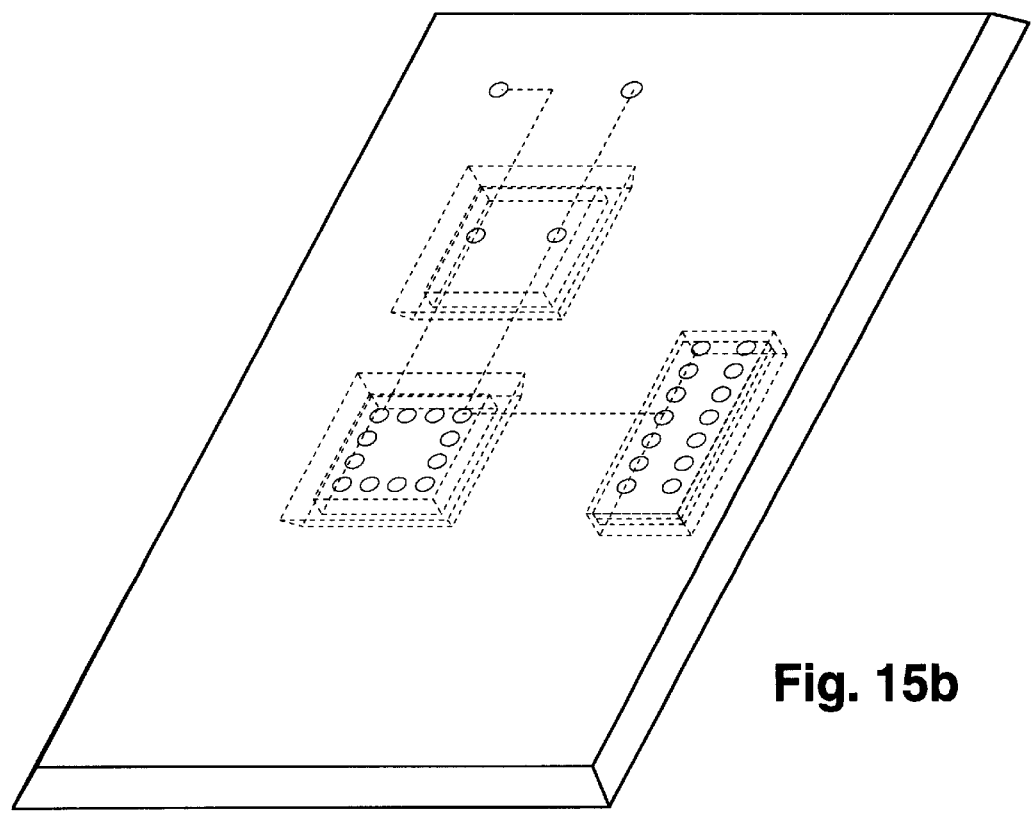

FIG. 15*b* shows the structure of FIG. 15*a* covered with a protective coating over the top surface to protect the pads 152 on top of the integrated circuits 151 and the electrically conductive traces 158 interconnecting selected pads and traces on the substrate 153. The protective coating typically can comprise a polymer, such as polyimide, or other plastic or epoxy.

Several substrates 153 of the type shown in FIG. 15*a* can be stacked one on top of the other to provide a compact three dimensional structure. The multiple layers of interconnects or traces on each board are connected either using through-hole vias, blind vias or hidden vias. A through-hole via is a via formed completely through the composite structure of substrates from the top to the bottom. A blind via is a via formed from one surface partially into the composite structure and a hidden via is a via formed internally within the composite structure but which does not extend to either the top or bottom surface of the composite structure. Conductive pads can then be used with the hidden vias to allow interconnections to be properly formed in the composite structure to provide a functioning electronic system incorporating integrated circuits contained in each of the substrates 153 making up the composite structure. Typically an electrically conductive land will be used in conjunction with each through-hole via or blind via on each printed circuit board which is desired to be electrically connected to other parts of the structure.

Figure 16:
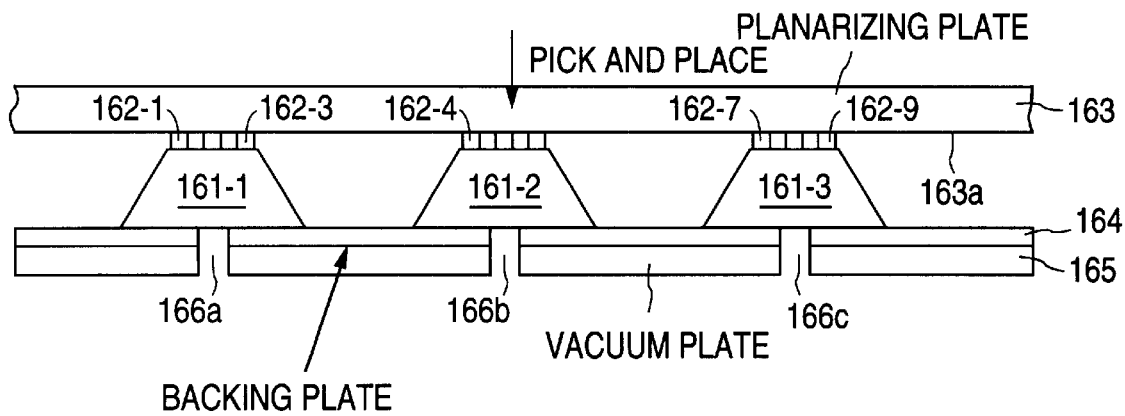
FIG. 16 shows an embodiment of this invention suitable for implementation using pick and place equipment.

FIG. 16 shows another method of fabricating a monolithic integrated structure in accordance with this invention using well known pick and place equipment. A plurality of integrated circuits shown as integrated circuit chips 161-1 through 161-3 are picked from a tray adjacent to the pick and place equipment. Each integrated circuit 161-1 through 161-3 is then placed by the pick and place equipment in an appropriate location on an underlying backing plate 164. Typically, backing plate 164 can be a laminate material, a thin metal such as copper or aluminum, nichrome, stainless steel or any other appropriate metal, or ceramic, for example. Openings 166a, 166b and 166c formed through backing plate 164 allow a vacuum to be pulled on the integrated circuits 161-1 through 161-3 to be placed over these openings by the pick and place equipment. Integrated circuits 161-1 through 161-3 are shown with tapered sides such that the surface of each integrated circuit having the largest dimension is directly adjacent to and in contact with backing plate 164. Obviously the sides of the integrated circuits 161-1 through 161-3 do not need to be tapered and could be vertical relative to backing plate 164. Vacuum plate 165 beneath backing plate 164 supports backing plate 164. Holes 166a, 166b, and 166c are shown formed through both backing plate 164 and vacuum plate 165. Obviously, vacuum plate 165 would be part of the vacuum system including a vacuum chamber for allowing a vacuum to be pulled through the openings 166a, 166b and 166c onto integrated circuits 161-1, 161-2 and 161-3 respectively. Conductive pads 162-1 through 162-9 are shown on the top surfaces of integrated circuits 161-1, 161-2 and 161-3. Directly adjacent these conductive pads is placed planarizing plate 163. The surface 163a of planarizing plate 163 in direct contact with pads 162 typically will have placed on it a Teflon or other material which makes it easy to remove the planarizing plate from contact with both integrated circuits 161-1 through 161-3 and the material to be inserted between these integrated circuits during the manufacturing process associated with this invention. Typically, a thermoplastic material of the type used for injection molding would be injected into the interstitial spaces between integrated circuits 161-1 through 161-3 out to the edges of the mold in which planarizing plate 163, backing plate 164 and vacuum plate 165 are placed. Alternatively, a preformed substrate of plastic material (not shown) can be placed over integrated circuits 161-1 through 161-3 with openings in the preformed substrate for allowing the preformed substrate to slip down into the interstitial regions between the integrated circuits 161-1 through 161-3. This preformed plastic substrate would then be heated to flow and form around the integrated circuits 161-1 through 161-3.

Under some circumstances, backing plate 164 will be flexible in which case integrated circuits 161-1 through 161-3 of different thicknesses can be accommodated on the same substrate.

The planarizing plate 163 can also be used to push excess plastic down into the interstitial spaces between the integrated circuits 161-1 through 161-3 to ensure a uniform and substantially equal thickness structure formed from the plastic in the interstitial regions between these integrated circuits 161-1 through 161-3.

The planarizing plate 163 will ensure that the plastic formed in the interstitial regions between the integrated circuits 161-1 through 161-3 will have a planar surface substantially co-planar with the pads 162-1 through 162-9 on the exposed surfaces of the integrated circuits 161-1 through 161-3. Should there be any irregularities in thickness of the resulting structure, the backside surface will have to absorb those irregularities either by having bumps or dimples in it. Thus, in some embodiments, the backside plate 164 must be flexible so that when vacuum plate 165 is removed prior to the molding process, the planarizing layer 163 can ensure that the top surfaces of integrated circuits 161-1 through 161-3 are in the same plane even if this causes a lack of planarity in backside plate 164.

One of the advantages of this invention is that it allows the accurate placement of the integrated circuits relative to one another on this substrate and further allows the maintenance of this placement throughout the process.

Pick and place tooling allows the integrated circuits to be placed on the substrate or the template as the case may be and visibly checked for accurate placement. The integrated circuits can then be placed on and glued to this substrate or otherwise held on the substrate in a manner that maintains their relative locations on the substrate throughout the process.

While this invention has been described in terms of several embodiments, other embodiments will be obvious to those skilled in the art in view of this disclosure.

What is claimed is:

1. The method of fabricating a monolithic integrated structure containing one or more integrated circuit chips embedded in a substrate comprising:

placing the one or more integrated circuit chips to be embedded in said substrate in a template;

pressing the template against the top surface of the substrate in which the one or more integrated circuit chips are to be embedded;

heating the substrate so as to soften the material making up the substrate;

pressing the one or more integrated circuit chips placed on the top surface of said substrate into the softened material of the substrate using a planarizing plate until the top surfaces of said one or more integrated circuit chips are substantially coplanar with the top surface of said substrate; and allowing the substrate containing the one or more integrated circuit chips to cool.

2. The method of claim 1 wherein said substrate is formed of a heat sensitive material which softens under increased pressure and temperature thereby to allow said integrated circuit chip to be pressed into the softened material of said substrate.

3. The method of claim 2 including the steps of:

heating said substrate to soften the material making up said substrate;

pressing on said integrated circuit chip with a planar structure to press said integrated circuit chip into the softened substrate material until the top surface of said integrated circuit chip is approximately coplanar with the top surface of said substrate; and allowing the substrate to cool thereby to adherently embed the integrated circuit chip into said substrate.

4. The method of claim 1 including the additional steps of forming a conductive layer over the top surfaces of said one or more integrated circuit chips and the top surface of said substrate; and patterning the conductive layer to form an electrically conductive interconnect structure which interconnects the one or more integrated circuit chips formed in said substrate into a desired electronic system.

5. The method of claim 4 including:

mounting said one or more integrated circuit chips in said template such that the surface of each of the one or more integrated circuit chips which contain conductive pads faces the substrate in which the one or more integrated circuit chips are to be embedded;

placing the one or more integrated circuit chips on the surface of said substrate using said template;

embedding said one or more integrated circuit chips into said substrate by heating the substrate to soften the substrate material and pressing on said integrated circuit chips until the top surface of each of said one or more integrated circuit chips containing the pads has penetrated through the softened substrate material to a planarizing plate on the opposite surface of said substrate; and allowing the substrate to cool.

6. The method of claim 5 including:

placing on said opposite surface of said substrate conductive material in electrical contact with the pads on the surface of each of said one or more integrated circuit chips; and forming the conductive material into an electrically conductive interconnect pattern to interconnect the one or more integrated circuit chips in said substrate into a desired electrical circuit.

7. The method of claim 6 including:

applying a prepreg layer to the back surfaces of said one or more integrated circuit chips and said substrate thereby to seal said one or more integrated circuit chips in said substrate.

8. The method of fabricating a structure containing a plurality of integrated circuit chips which comprises:

placing a plurality of integrated circuit chips in a template, each integrated circuit chip having one surface directly adjacent said template upon which has been formed a plurality of electrically conductive pads;

placing said template adjacent a substrate of heat-softenable material such that the surface of each integrated circuit chip opposite said one surface is in contact with said substrate;

heating said substrate so as to allow each integrated circuit chip to adhere to said substrate;

removing said template and placing a planarizing plate adjacent the surfaces of said integrated circuit chips containing said electrically conductive pads;

heating said substrate so as to soften the material of said substrate; and using the planarizing plate to press said integrated circuit chips into the softened material of said substrate until the top surface of each of the integrated circuit chips is approximately coplanar with the top surface of said substrate.

9. The method of claim 8 including:

cooling said substrate thereby to allow the material of said substrate to harden and thus firmly imbed the integrated circuit chips in said substrate.

10. The method of claim 9 wherein said planarizing plate has a coating of material formed on the surface of said planarizing plate in contact with said integrated circuit chips to allow said planarizing plate to be easily removed from contact with said integrated circuit chips.

11. The method of fabricating a monolithic integrated structure containing one or more integrated circuit chips, which comprises:

providing a substrate;

picking one or more integrated circuit chips from a source of such integrated circuit chips and placing each of said one or integrated circuit chips in a corresponding location on said substrate such that each such integrated circuit chip so placed is properly oriented in accordance with a planned orientation, wherein each corresponding location is not in a cavity in said substrate;

causing each such integrated circuit chip to be adherently held in position on said substrate.

12. The method of fabricating a monolithic integrated structure containing one or more integrated circuit chips, which comprises:

providing a substrate;

picking one or more integrated circuit chips from a source of such integrated circuit chips and placing each of said one or integrated circuit chips in a corresponding location on such substrate such that each such integrated circuit chip so placed is properly oriented in accordance with a planned orientation;

causing each such integrated circuit chip to be adherently held in position on said substrate;

the method also including:

heating such substrate so as to soften the material of such substrate;

pressing each of said integrated circuit chips into the softened material of such substrate such that the top surface of each of said integrated circuit chips is visible but substantially coplanar with the top surface of said substrate; and allowing the substrate to cool, thereby to solidly embed each of said integrated circuit chips in said cooled substrate.

13. The method of claim 12 including:

forming a layer of conductive material over the top surfaces of each of said integrated circuit chips and over the top surface of said substrate; and patterning said conductive material into a selective electrically conductive interconnect pattern, thereby to interconnect said integrated circuit chips into a desired electrical circuit or system.

14. The method of fabricating a monolithic integrated structure containing one or more integrated circuit chips which comprises:

providing a substrate having a top surface thereon;

providing a template with openings in one surface thereof for receipt of one or more integrated circuit chips;

picking one or more integrated circuit chips from a source of such integrated circuit chips and placing each of said one or more integrated circuit chips in a corresponding opening in said template such that each said integrated circuit chip so placed is properly oriented in accordance with a planned orientation; and placing said template adjacent said substrate such that the one or more integrated circuit chips in said template are placed in corresponding locations on said substrate.

15. The method of claim 14 including:

applying adhesive to the top surface of said substrate; and pressing the one or more integrated circuit chips held by said template against said adhesive thereby to cause said one or more integrated circuit chips to be held in the proper orientation on the top surface of said substrate.

16. The method of claim 14 including:

heating said substrate such that said top surface becomes tacky; and pressing the one or more package components held by said template against said tacky top surface thereby to cause said one or more integrated circuit chips to be held in the proper orientation on said top surface.

17. The method of claim 15 including:

removing said template from said substrate while leaving the one or more integrated circuit chips in proper location on said substrate.

* * * * *